US012787737B2

(12) United States Patent
Su

(10) Patent No.: US 12,787,737 B2
(45) Date of Patent: Nov. 3, 2026

(54) METHOD OF MANUFACTURING SEMICONDUCTOR STRUCTURE

(71) Applicant: NANYA TECHNOLOGY CORPORATION, New Taipei City (TW)

(72) Inventor: Kuo-Hui Su, New Taipei City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 337 days.

(21) Appl. No.: 18/635,407

(22) Filed: Apr. 15, 2024

(65) Prior Publication Data

US 2025/0323093 A1 Oct. 16, 2025

(51) Int. Cl.

*H10W 20/00* (2026.01)
*H10P 14/40* (2026.01)

(52) U.S. Cl.

CPC ......... *H10W 20/092* (2026.01); *H10P 14/412* (2026.01); *H10W 20/076* (2026.01); *H10W 20/089* (2026.01)

(58) Field of Classification Search

CPC ............. H10W 20/092; H10W 20/076; H10W 20/089; H10P 14/412
USPC .......................................................... 438/618
See application file for complete search history.

(56) References Cited

U.S. PATENT DOCUMENTS

2013/0075784 A1 3/2013 Ikeda
2021/0242211 A1* 8/2021 Huang .................. H10B 12/34

FOREIGN PATENT DOCUMENTS

CN 112490181 A * 3/2021 .......... H10W 20/057
CN 113517290 A 10/2021
CN 117373918 A 1/2024
TW 202335191 A 9/2023

OTHER PUBLICATIONS

Office Action and and the search report mailed on Sep. 2, 2025 related to Taiwanese Application No. 114106381.
Office Action and and the search report mailed on Sep. 22, 2025 related to Taiwanese Application No. 114106381.
Summary translations of Office Actions and and the search reports Taiwanese Application No. 114106381 mailed on Sep. 2, 2025 and Sep. 22, 2025.
Office Action and and the search report mailed on Mar. 17, 2025 related to Taiwanese Application No. 113121821.
Summary translation of Office Action and English Abstracts of foreign patent documents related to Taiwanese Application No. 113121821.

* cited by examiner

*Primary Examiner* — Phuc T Dang
(74) *Attorney, Agent, or Firm* — Xuan Zhang

(57) ABSTRACT

The present application provides a semiconductor structure and a manufacturing method of the semiconductor structure. A planar surface of a silicon pillar is provided. At least one first trench is created in a substrate. A conductive material is deposited to partially fill the first trench. An insulative piece is formed in the first trench and extends into the conductive material. An isolation material is deposited in the first trench to cap the conductive material exposed around the insulative piece. The depositing of the isolation material further includes enclosing at least one void in the isolation material.

10 Claims, 23 Drawing Sheets

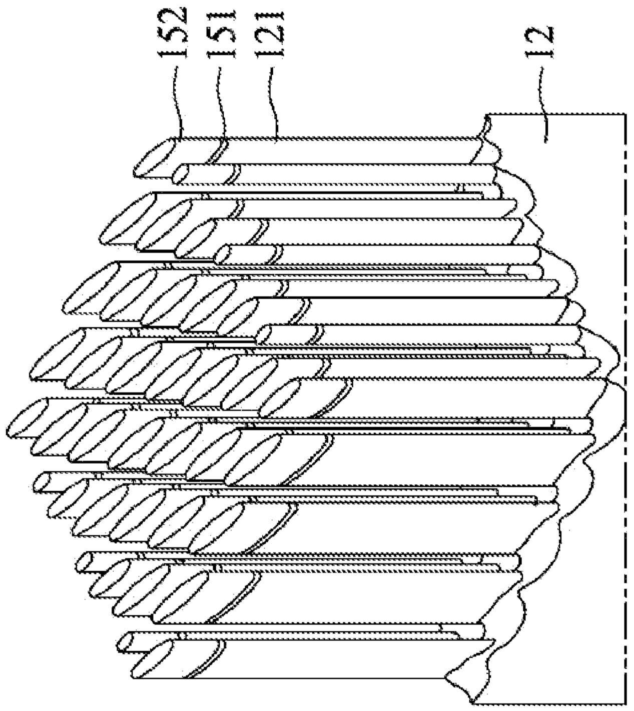
FIG. 3
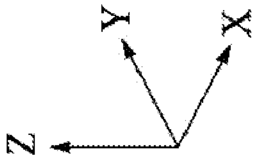

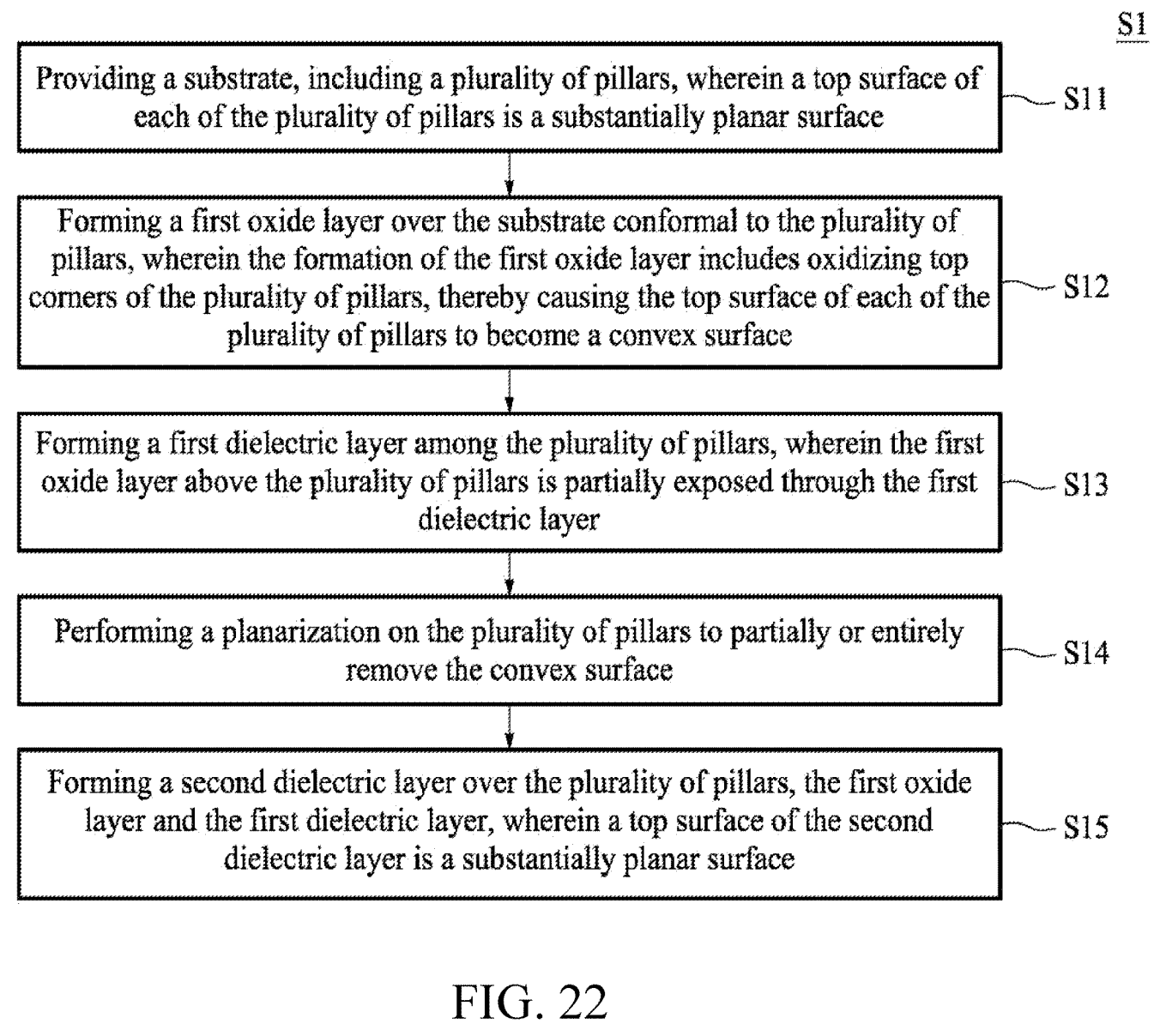

S1

S11: Providing a substrate, including a plurality of pillars, wherein a top surface of each of the plurality of pillars is a substantially planar surface

↓

S12: Forming a first oxide layer over the substrate conformal to the plurality of pillars, wherein the formation of the first oxide layer includes oxidizing top corners of the plurality of pillars, thereby causing the top surface of each of the plurality of pillars to become a convex surface

↓

S13: Forming a first dielectric layer among the plurality of pillars, wherein the first oxide layer above the plurality of pillars is partially exposed through the first dielectric layer

↓

S14: Performing a planarization on the plurality of pillars to partially or entirely remove the convex surface

↓

S15: Forming a second dielectric layer over the plurality of pillars, the first oxide layer and the first dielectric layer, wherein a top surface of the second dielectric layer is a substantially planar surface

FIG. 22

METHOD OF MANUFACTURING SEMICONDUCTOR STRUCTURE

TECHNICAL FIELD

The present disclosure relates to a method of manufacturing a semiconductor structure and a semiconductor structure formed by the method. In particular, the present disclosure relates to a method of preparing a planar surface for fabrication of a recessed-access structure and the structure thereof.

DISCUSSION OF THE BACKGROUND

Semiconductor devices are used in a variety of electronic applications, such as personal computers, cellular phones, digital cameras, and other electronic equipment. The semiconductor devices are typically fabricated by sequentially depositing insulating or dielectric layers, conductive layers, and semiconductive layers of material over a semiconductor substrate, and patterning the various material layers using lithography to form circuit components and elements thereon. As the semiconductor industry has progressed into advanced technology process nodes in pursuit of greater device density, higher performance, and lower costs, challenges of precise control of configuration of an element have arisen.

This Discussion of the Background section is provided for background information only. The statements in this Discussion of the Background are not an admission that the subject matter disclosed in this Discussion of the Background section constitute prior art to the present disclosure, and no part of this Discussion of the Background section may be used as an admission that any part of this application, including this Discussion of the Background section, constitutes prior art to the present disclosure.

SUMMARY

One aspect of the present disclosure provides a method for manufacturing a semiconductor structure. The method includes creating at least one first trench in a substrate; depositing a conductive material to partially fill the first trench; forming an insulative piece in the first trench and extending into the conductive material; and depositing an isolation material in the first trench to cap a portion of the conductive material exposed around the insulative piece. The depositing of the isolation material further comprises enclosing at least one void in the isolation material.

Another aspect of the present disclosure provides a method for manufacturing a semiconductor structure. The method includes forming a silicon portion, a plurality of dielectric portions and a plurality of oxide portions in a substrate; forming at least one first trench in the silicon portion of the substrate; forming a word line in the first trench; forming a plurality of first impurity regions and a plurality of second impurity regions in the substrate; forming a first dielectric layer over the substrate and covering the word line; and forming a second dielectric layer to cover the first dielectric layer. The first trench has a W-shaped contour. Each of the second impurity regions is disposed between a pair of legs of the word line.

Another aspect of the present disclosure provides a semiconductor structure. The semiconductor structure includes a substrate having a silicon portion, a plurality of dielectric portions and a plurality of oxide portions; at least one first trench disposed in the silicon portion of the substrate; a word line disposed in the first trench; and a plurality of first impurity regions and a plurality of second impurity regions disposed in the substrate. The trench has a W-shaped contour. Each of the second impurity regions is disposed between a pair of legs of the word line.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

FIG. 3 is an enlarged diagram of a portion of the intermediate stage in the formation of the semiconductor structure shown in FIG. 2 in accordance with some embodiments of the present disclosure.

FIG. 22 is a flow diagram illustrating a method of manufacturing a semiconductor structure in accordance with some embodiments of the present disclosure.

DETAILED DESCRIPTION

Figure 1:
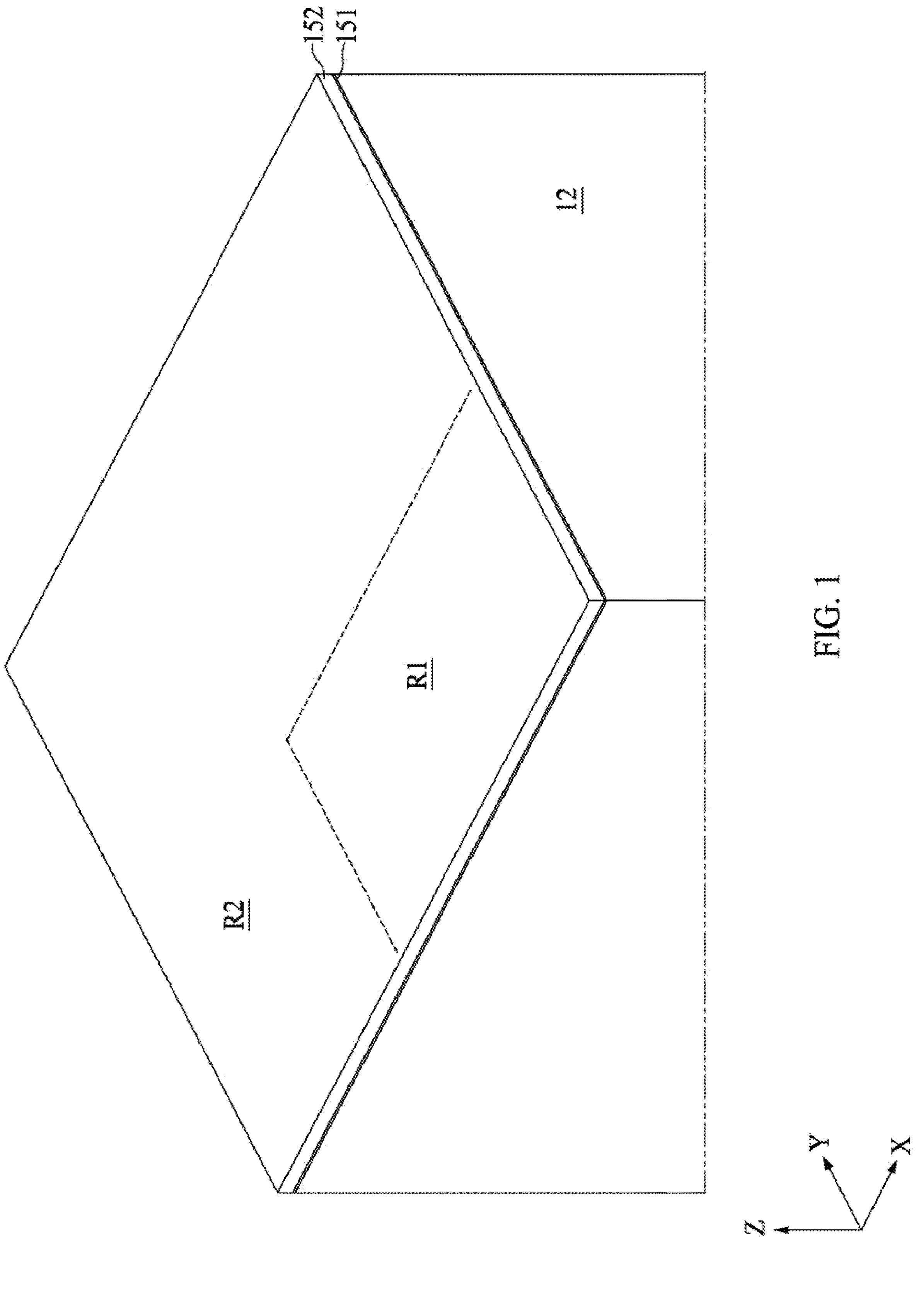
FIG. 1 is a schematic 3D diagram of an intermediate stage in formation of a semiconductor structure in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It should be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It should be understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

As the semiconductor industry has progressed into advanced technology process nodes in pursuit of greater device density, it is important to reach an advanced precision of control of a configuration of elements formed in a device. For instance, a configuration of a silicon pillar of a substrate in an array region of a memory device can be affected by operations performed in subsequent processes. When undesired oxidation on the silicon pillar occurs, the configuration of the silicon pillar is changed. Rounding of edges or formation of an uneven surface of the silicon pillar results in a reduction of a contact area between the silicon pillar and a landing pad, and an electrical disconnection or a high electrical resistance between the silicon pillar and the landing pad occurs. The present disclosure relates to a method for manufacturing a semiconductor structure. In particular, the method of the present disclosure is able to provide a planar surface of a silicon pillar so as to avoid issues of electrical disconnection and high electric resistance. A performance of a device formed according to the method and a product yield can be thereby improved.

FIGS. 1 to 19 are schematic diagrams from different perspectives illustrating various fabrication stages according to one or more methods for manufacturing a semiconductor structure in accordance with some embodiments of the present disclosure. The stages shown in FIGS. 1 to 19 are also illustrated schematically in process flows of a method S1 in FIG. 22 or a method S2 in FIG. 23.

Referring to FIG. 1, one or more dielectric layers are formed over a substrate 12. In some embodiments, prior to the formation of the dielectric layer(s), the substrate 12 is provided, received, or formed.

In some embodiments, the substrate 12 may have a multilayer structure, or the substrate 12 may include a multilayer compound semiconductor structure. In some embodiments, the substrate 12 includes semiconductor devices, electrical components, electrical elements, or a combination thereof. In some embodiments, the substrate 12 includes transistors or functional units of transistors. In some embodiments, the substrate 12 includes active components, passive components, and/or conductive elements. The active components may include a memory die (e.g., a dynamic random-access memory (DRAM) die, a static random-access memory (SRAM) die, etc.), a power management die (e.g., a power management integrated circuit (PMIC) die), a logic die (e.g., a system-on-a-chip (SoC), a central processing unit (CPU), a graphics processing unit (GPU), an application processor (AP), a microcontroller, etc.), a radio frequency (RF) die, a sensor die, a micro-electro-mechanical-system (MEMS) die, a signal processing die (e.g., a digital signal processing (DSP) die), a front-end die (e.g., an analog front-end (AFE) die) or other active components. Each of the active components may include multiple transistors. The transistors can include planar transistors, multi-gate transistors, gate-all-around field-effect transistors (GAAFET), fin field-effect transistors (FinFET), vertical transistors, nanosheet transistors, nanowire transistors, or a combination thereof. The passive components may include a capacitor, a resistor, an inductor, a fuse or other passive components. The conductive elements may include metal lines, metal islands, conductive vias, contacts or other conductive elements.

The active components, passive components, and/or conductive elements as mentioned above can be formed in and/or over a semiconductor substrate. The semiconductor substrate may be a bulk semiconductor, a semiconductor-on-insulator (SOI) substrate, or the like. The semiconductor substrate can include an elementary semiconductor including silicon or germanium in a single crystal form, a polycrystalline form, or an amorphous form; a compound semiconductor material including at least one of silicon carbide, gallium arsenide, gallium phosphide, indium phosphide, indium arsenide, and indium antimonide; an alloy semiconductor material including at least one of SiGe, GaAsP, AlInAs, AlGaAs, GaInAs, GaInP, and GaInAsP; any other suitable materials; or a combination thereof. In some embodiments, the alloy semiconductor substrate may be a SiGe alloy with a gradient Si:Ge feature in which Si and Ge compositions change from one ratio at one location to another ratio at another location of the gradient SiGe feature. In another embodiment, the SiGe alloy is formed over a silicon substrate. In some embodiments, a SiGe alloy can be mechanically strained by another material in contact with the SiGe alloy.

For a purpose of simplicity, the substrate 12 depicted in FIG. 1 can be only a topmost portion of a multilayer structure of the substrate 12. The substrate 12 may include an array region R1 and a peripheral region R2 surrounding the array region R1. In some embodiments, the active components or the transistors are mostly formed in the array region R1, and the peripheral region R2 is for circuit routing and may include passive components. In some embodiments, the substrate 12 includes a silicon material.

Memory cells or devices (not shown) may be formed in the array region R1 of the substrate 12. For a purpose of illustration, the figures show a portion of the substrate 12 above the memory cells or memory devices. Bit line (BL) metals and word line (WL) metals (not shown) are formed during subsequent processing over and in the topmost portion of the substrate 12 shown in FIG. 1.

A dielectric layer 151 and a dielectric layer 152 can be formed over the substrate 12. In some embodiments, the dielectric layer 151 and the dielectric layer 152 include different dielectric materials. In some embodiments, the dielectric materials include silicon oxide ($SiO_x$), silicon nitride ($Si_xN_y$), silicon oxynitride (SiON), or a combination thereof. In some embodiments, the dielectric materials include a high-k dielectric material. The high-k dielectric material may have a dielectric constant (k value) greater than 4. The high-k dielectric material may include zirconium dioxide ($ZrO_2$), hafnium oxide ($HfO_2$), aluminum oxide ($Al_2O_3$), yttrium oxide ($Y_2O_3$), lanthanum oxide ($La_2O_3$), silicates of one or more of $ZrO_2$, $HfO_2$, $Al_2O_3$, $Y_2O_3$ and $La_2O_3$, aluminates of one or more of $ZrO_2$, $HfO_2$, $Y_2O_3$ and $La_2O_3$, tantalum oxide ($Ta_2O_5$), barium titanate ($BaTiO_3$), titanium dioxide ($TiO_2$), cerium oxide ($CeO_2$), lanthanum aluminum oxide ($LaAlO_3$), lead titanate ($PbTiO_3$), strontium titanate ($SrTiO_3$), lead zirconate ($PbZrO_3$), tungsten oxide ($WO_3$), bismuth silicon oxide ($Bi_4Si_2O_{12}$), barium strontium titanate (BST) ($Ba_{1-x}Sr_xTiO_3$), PMN ($PbMg_xNb_{1-x}O_3$), PZT ($PbZr_xTi_{1-x}O_3$), PZN ($PbZn_xNb_{1-x}O_3$), PST ($PbSc_xTa_{1-x}O_3$), hafnium zirconium oxide ($Hf_xZr_yO_z$), hafnium zirconium aluminum oxide ($Hf_wZr_xAl_yO_z$), lithium oxide ($Li_2O$), hafnium silicon oxide ($HfSiO_4$), strontium oxide (SrO), scandium oxide ($Sc_2O_3$), molybdenum trioxide ($MoO_3$), barium oxide (BaO), or a combination thereof. Other suitable materials are within the contemplated scope of this disclosure.

In some embodiments, the dielectric layers 151 and 152 include different oxide materials selected from those listed above. In some embodiments, the dielectric layers 151 and 152 are formed by different depositions. In some embodiments, a thickness of the dielectric layer 151 is less than a thickness of the dielectric layer 152. The dielectric layers 151 and 152 may function to protect the substrate 12 from a patterning operation that is subsequently performed. The two dielectric layers 151 and 152 are shown for a purpose of illustration. In alternative embodiments, only one dielectric layer is formed over the substrate 12. In other alternative embodiments, more than two dielectric layers are formed over the substrate 12.

Figure 2:
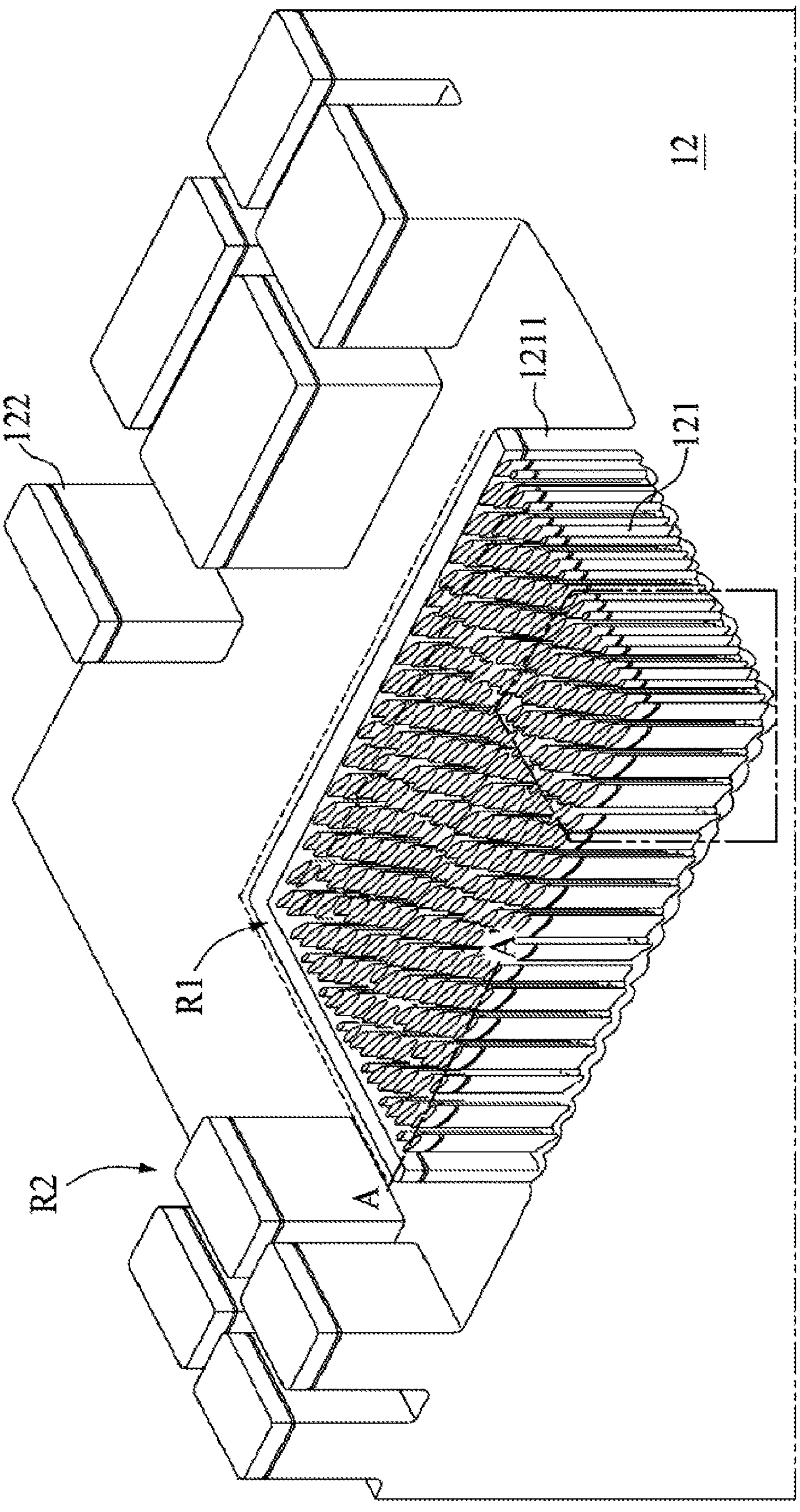
FIG. 2 is a schematic 3D diagram of an intermediate stage in formation of a semiconductor structure in accordance with some embodiments of the present disclosure.
Figure 4:
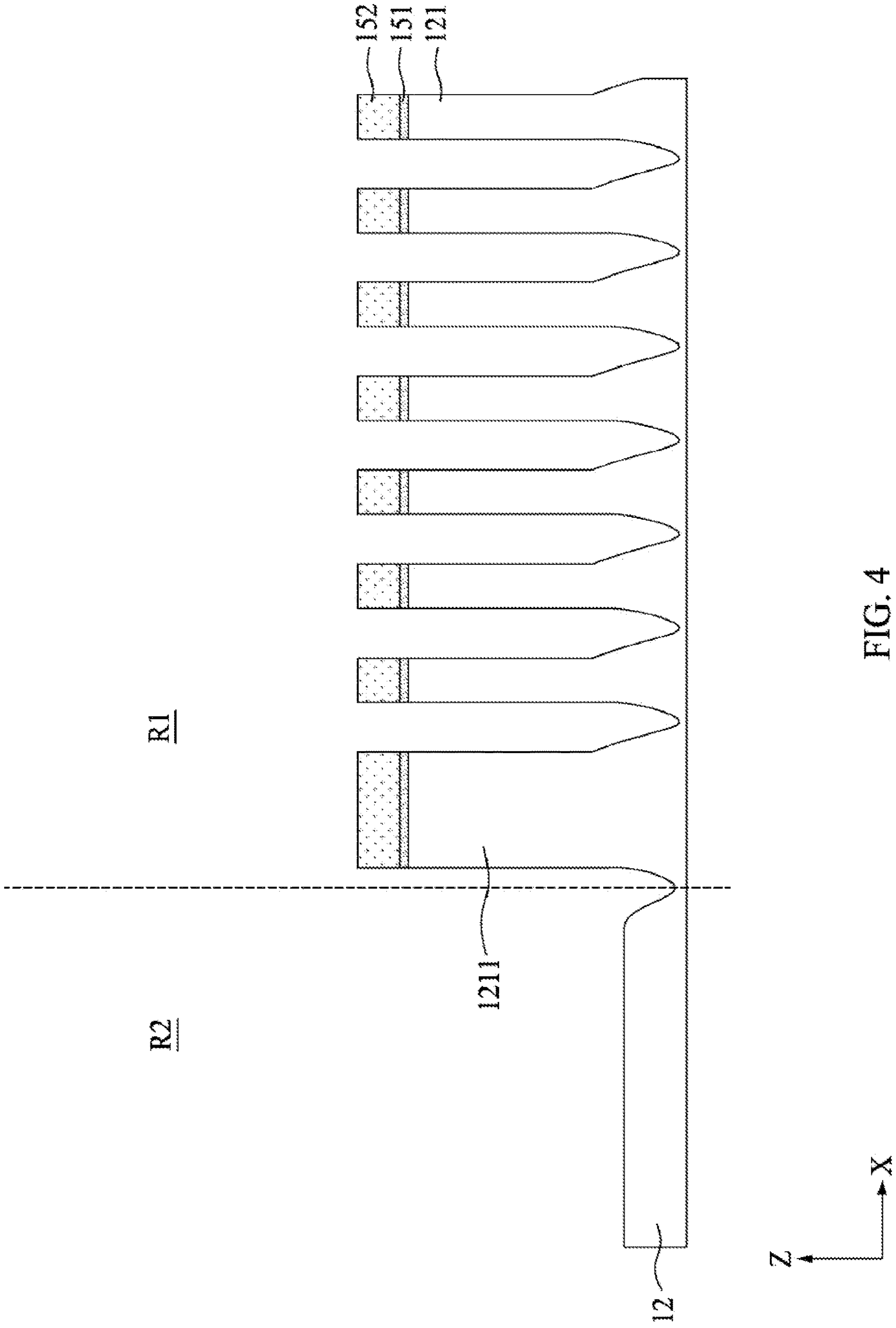
FIGS. 4 to 19 are cross-sectional diagrams along a line A-A' shown in FIG. 2 of intermediate stages in the formation of a semiconductor structure in accordance with some embodiments of the present disclosure.

Referring to FIGS. 2, 3 and 4, FIG. 2 is a schematic 3D diagram, FIG. 3 is an enlarged view of a portion of the array region R1 indicated by a dotted line in FIG. 2, and FIG. 4 is a schematic cross-sectional diagram along a line A-A' in FIG. 2 at a stage of one or more methods for manufacturing a semiconductor structure in accordance with some embodiments of the present disclosure. A patterning operation may be performed on the dielectric layers 151 and 152 and the substrate 12. In some embodiments, multiple pillar-like silicon portions 121 are formed in the array region R1. In some embodiments, multiple island-like silicon portions 122 are formed in the peripheral region R2. In some embodiments, each of the dielectric layers 151 and 152 is patterned into portions. In some embodiments, each pillar-like silicon portion 121 has a portion of the dielectric layer 151 and a portion of the dielectric layer 152 disposed thereon. In some embodiments, each island-like silicon portion 122 has a portion of the dielectric layer 151 and a portion of the dielectric layer 152 disposed thereon.

It should be noted that a silicon portion 1211 of the plurality of silicon portions 121 has a configuration different from other silicon portions 121 as shown in FIGS. 2 and 4. The silicon portion 1211 may extend along a periphery of the array region R1. The silicon portion 1211 can be a dummy structure in a memory device formed in subsequent processing. In some embodiments, the silicon portion 1211 is not considered a part of an array of memory cells of the memory device. In some embodiments, the silicon portion 1211 is for a purpose of definition of an area of the array of memory cells of the memory device.

The patterning operation performed on the dielectric layers 151 and 152 and the substrate 12 may include one or more etching operations. In some embodiments, the dielectric layers 151 and 152 and the substrate 12 are patterned sequentially by different etching operations. In some embodiments, one or more etching operations having a high selectivity to the dielectric materials of the dielectric layer 151 and/or the dielectric layer 152 and a low selectivity to a silicon material of the substrate 12 are performed. The dielectric layers 151 and 152 can be patterned by one or more etching operations depending on the dielectric materials of the dielectric layers 151 and 152. A conventional patterning method can be applied, and is not limited herein. In some embodiments, an etching operation having a low selectivity to the silicon material of the substrate 12 is performed next. In some embodiments, the dielectric layers 151 and 152 and the substrate 12 are patterned concurrently by one etching operation. In some embodiments, a non-selective etching operation is performed, and the dielectric layers 151 and 152 and the substrate 12 are patterned concurrently by one etching operation.

FIGS. 5 to 19 are schematic cross-sectional diagrams along the line A-A' in FIG. 2 at a stage of the method S1 or the method S2 in accordance with some embodiments of the present disclosure. For a purpose of illustration, the schematic cross-sectional diagrams shown in FIGS. 5 to 19 are focused on the array region R1. However, such illustration is not intended to limit the present disclosure. Similar or same operations can be performed concurrently in the peripheral region R2. In some embodiments, all operations or processes described below are performed concurrently in the array region R1 and the peripheral region R2. In some embodiments, all operations or processes described below are performed on an entirety of the substrate 12.

Figure 5:
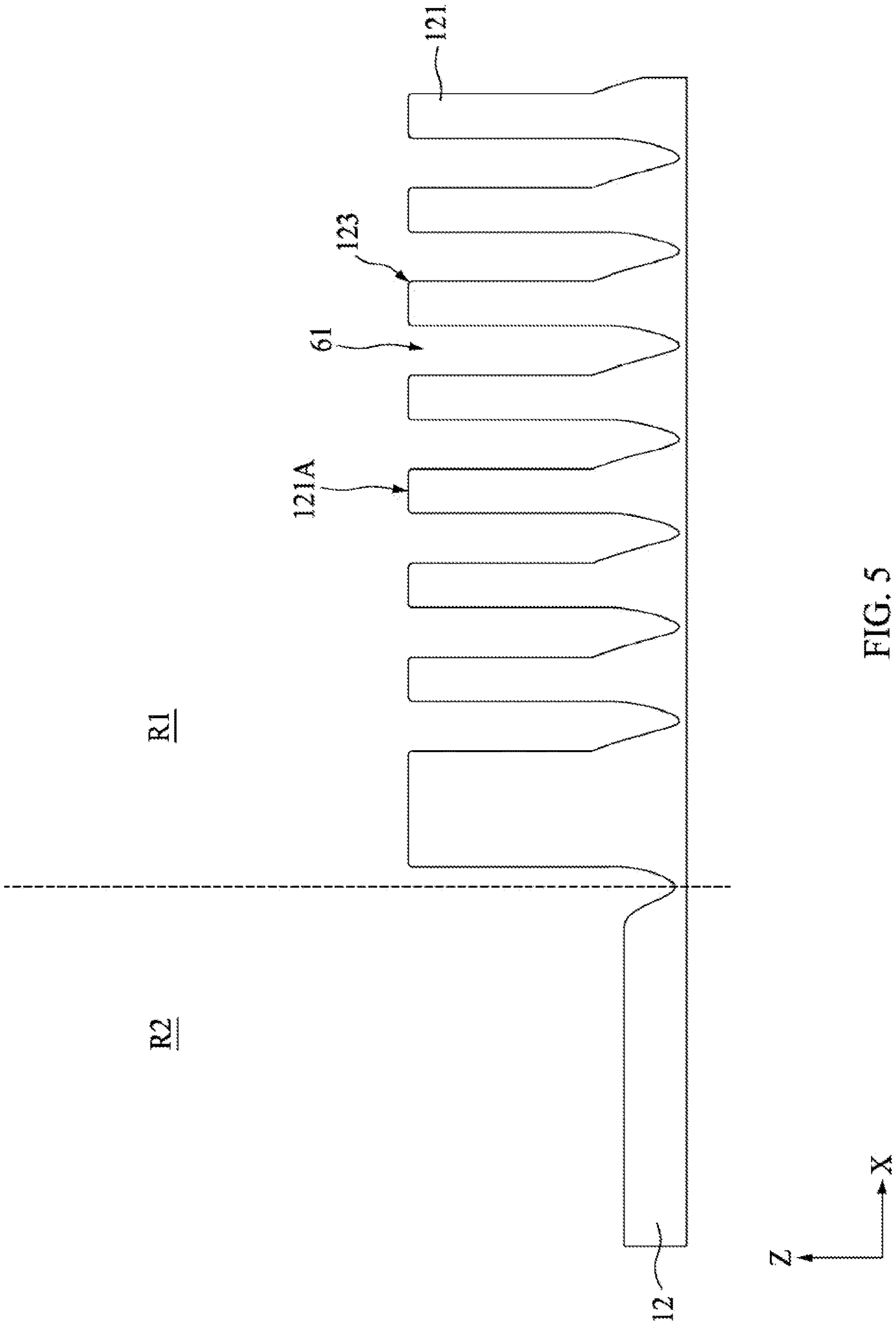

Referring to FIG. 5, the dielectric layers 151 and 152 are removed after the formation of the pillar-like silicon portions 121 and the island-like silicon portions 122. Similar to the process described above, one or more etching operations may be performed depending on the materials of the dielectric layers 151 and 152. The one or more etching operations for removing the dielectric layers 151 and 152 should have a low selectivity to the silicon material of the substrate 12. In some embodiments, a top surface 121A of each of the pillar-like silicon portions 121 is a substantially planar surface at this stage as shown in FIG. 5. A plurality of spaces 61 are defined among the pillar-like silicon portions 121 in the array region R1.

Figure 6:
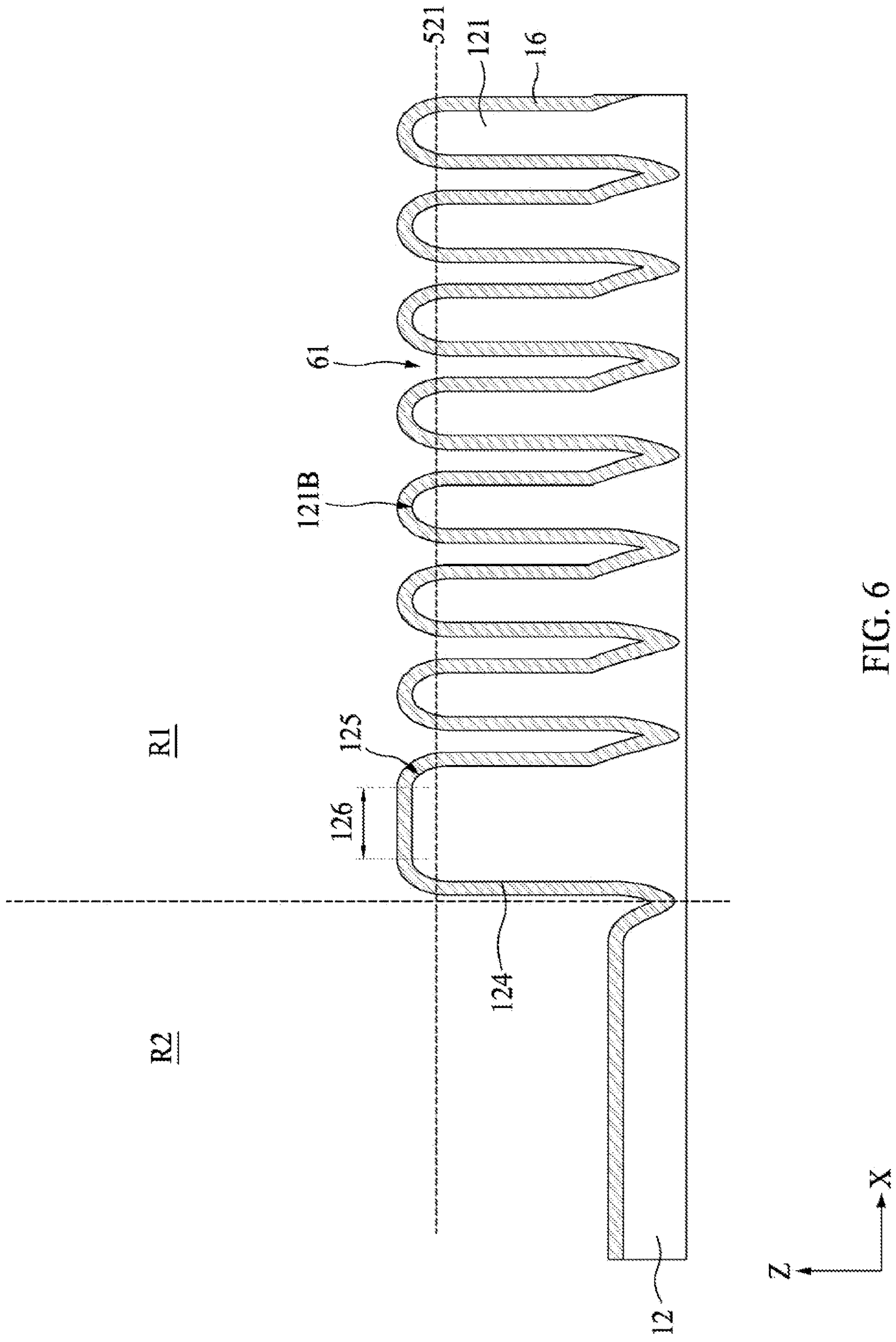

Referring to FIG. 6, an oxide layer 16 is formed over and conformal to the substrate 12. In some embodiments, a configuration of the oxide layer 16 is conformal to a configuration of the silicon portions 121 and 122 of the substrate 12. In some embodiments, the oxide layer 16 is formed by an oxidation. In some embodiments, the oxide layer 16 is formed by a deposition. In some embodiments, the oxide layer 16 is conformal to the pillar-like silicon portions 121 without filling the spaces 61 between the pillar-like silicon portions 121.

The silicon portions 121 and 122 may be oxidized during the formation of the oxide layer 16, thereby causing the top surfaces of the silicon portions 121 and top surfaces of the silicon portions 122 to become convex or rounded. As shown in FIG. 6, the top surface 121B of each of the silicon portions 121 is a convex surface or a rounded surface after the formation of the oxide layer 16. In some embodiments, top corners 123 (shown in FIG. 5) are oxidized during the formation of the oxide layer 16. In some embodiments, an entirety of the top surface 121B is rounded. In some embodiments, the top surface 121B includes rounded corners 125 and a planar portion 126 connecting the rounded corners 125. It should be noted that only the silicon portions 121 in the array region R1 are depicted in FIG. 6 for a purpose of illustration. It should be understood that the silicon portions 122 in the peripheral region R2 may have a configuration similar to those of the silicon portions 121 shown in FIG. 6. In some embodiments, each of the silicon portions 121 has a sidewall 124 connecting to and disposed below the convex top surface 121B. In some embodiments, the sidewall 124 is substantially planar, and a line 521 indicates a level of connecting points of the convex top surfaces 121B and the planar sidewalls 124 of the silicon portions 121. In some embodiments, the line 521 is at a bottom of the convex top surface 121B of the silicon portions 121.

In some embodiments, the oxide layer 16 is conformal to the convex surface 121B of the silicon portions 121. In some embodiments, the oxide layer 16 includes a substantially planar surface below the line 521. In some embodiments, a thickness of the oxide layer 16 is substantially consistent across the substrate 12. In some embodiments, the oxide layer 16 covers an entirety of the substrate 12.

Figure 7:
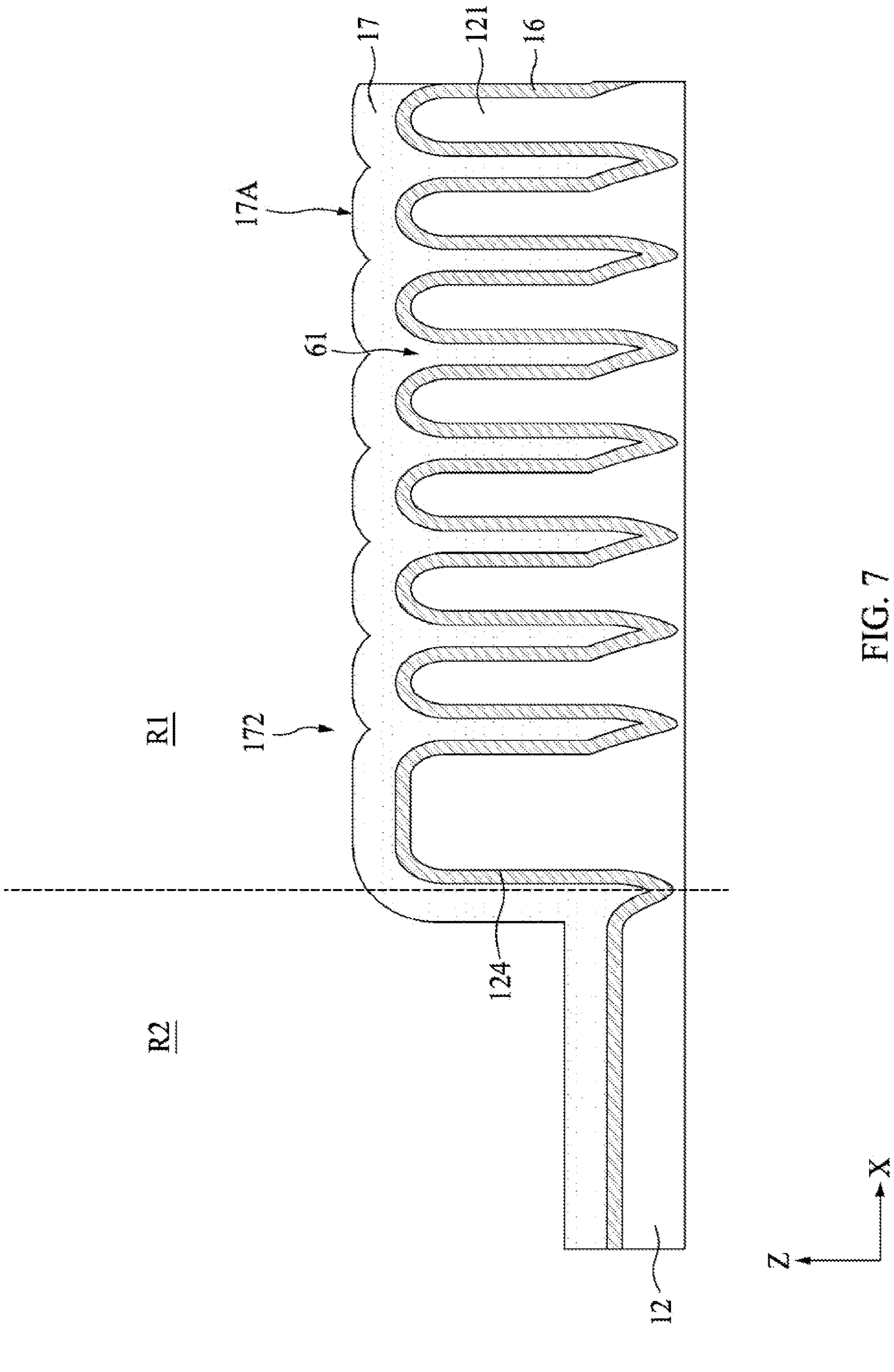

Referring to FIG. 7, a dielectric layer 17 is formed over and conformal to the substrate 12 and the silicon portions 121. In some embodiments, the dielectric layer 17 has a thickness substantially greater than a thickness of the oxide layer 16. The dielectric layer 17 can comprise one or more dielectric materials selected from the dielectric materials described in reference to the dielectric layers 151 and 152, and repeated description is omitted herein. In some embodiments, the dielectric layer 17 includes a dielectric material different from that of the oxide layer 16. In some embodiments, the dielectric layer 17 does not include oxide. In some embodiments, the dielectric layer 17 includes silicon nitride.

In some embodiments, the dielectric layer 17 is formed by a blanket deposition. In some embodiments, the formation of the dielectric layer 17 includes a chemical vapor deposition (CVD), a physical vapor deposition (PVD), or a combination thereof. In some embodiments, the dielectric layer 17 at least fills the spaces 61 among the silicon portions 121 in the array region R1. In some embodiments, the dielectric layer 17 is disposed over the oxide layer 16 and among portions of the oxide layer 16 on the sidewalls 124 of the silicon portions 12. In some embodiments, a thickness of the dielectric layer 17 is substantially greater than one-half of a distance between the silicon portions 12 for a purpose of filling the spaces 61. In some embodiments, a top surface 17A of the dielectric layer 17 is not a planar surface. In some embodiments, the top surface 17A of the dielectric layer 17 includes a plurality of recesses 172 corresponding to positions of the spaces 61 due to a property of a deposition.

Figure 8:
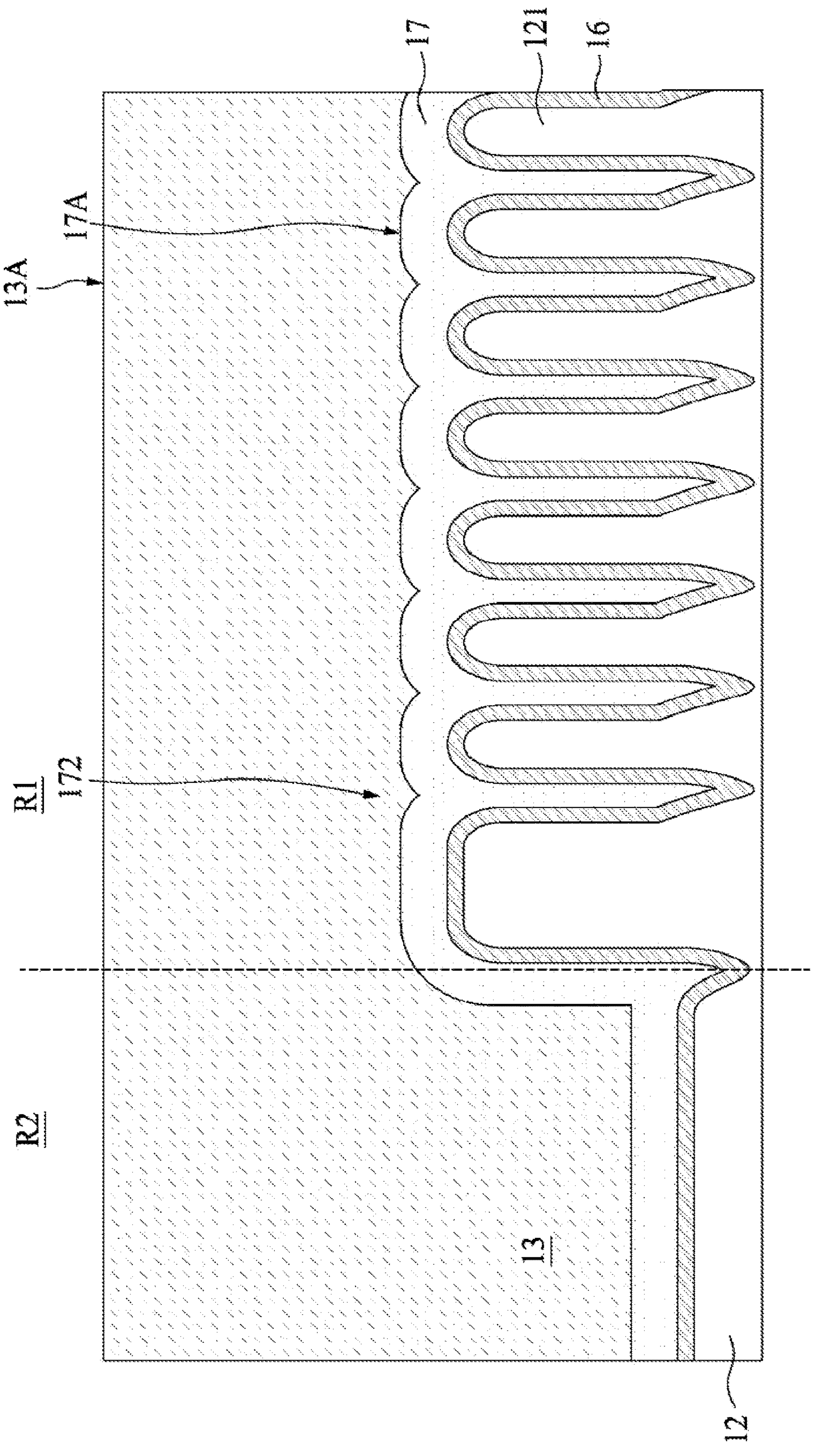

Referring to FIG. 8, a dielectric layer 13 is formed over the dielectric layer 17. In some embodiments, the dielectric layer 13 is in physical contact with the top surface 17A of the dielectric layer 17. In some embodiments, the dielectric layer 13 fills the recesses 172 of the dielectric layer 17. The dielectric layer 13 and the dielectric layer 17 are for a purpose of electrical isolation between elements. In some embodiments, the dielectric layers 13 and 17 can be considered as a dielectric structure. In some embodiments, the dielectric layers 13 and 17 can be considered as two sublayers of a dielectric layer. In some embodiments, a top surface 13A of the dielectric layer 13 is substantially planar. In some embodiments, the dielectric layer 13 is configured to provide a planar surface for an etching operation or a polishing operation to be performed during subsequent processing in order to provide a better removal result. In some embodiments, the dielectric layer 13 includes a dielectric material, an anti-reflective coating material, an oxide-containing material, or other suitable materials. The dielectric layer 13 can include one or more dielectric materials selected from the dielectric materials described in reference to the dielectric layers 151 and 152, and repeated description is omitted herein. In some embodiments, the dielectric layer 13 includes a dielectric material different from that of the dielectric layer 17 for a purpose of etching selectivity.

Figure 9:
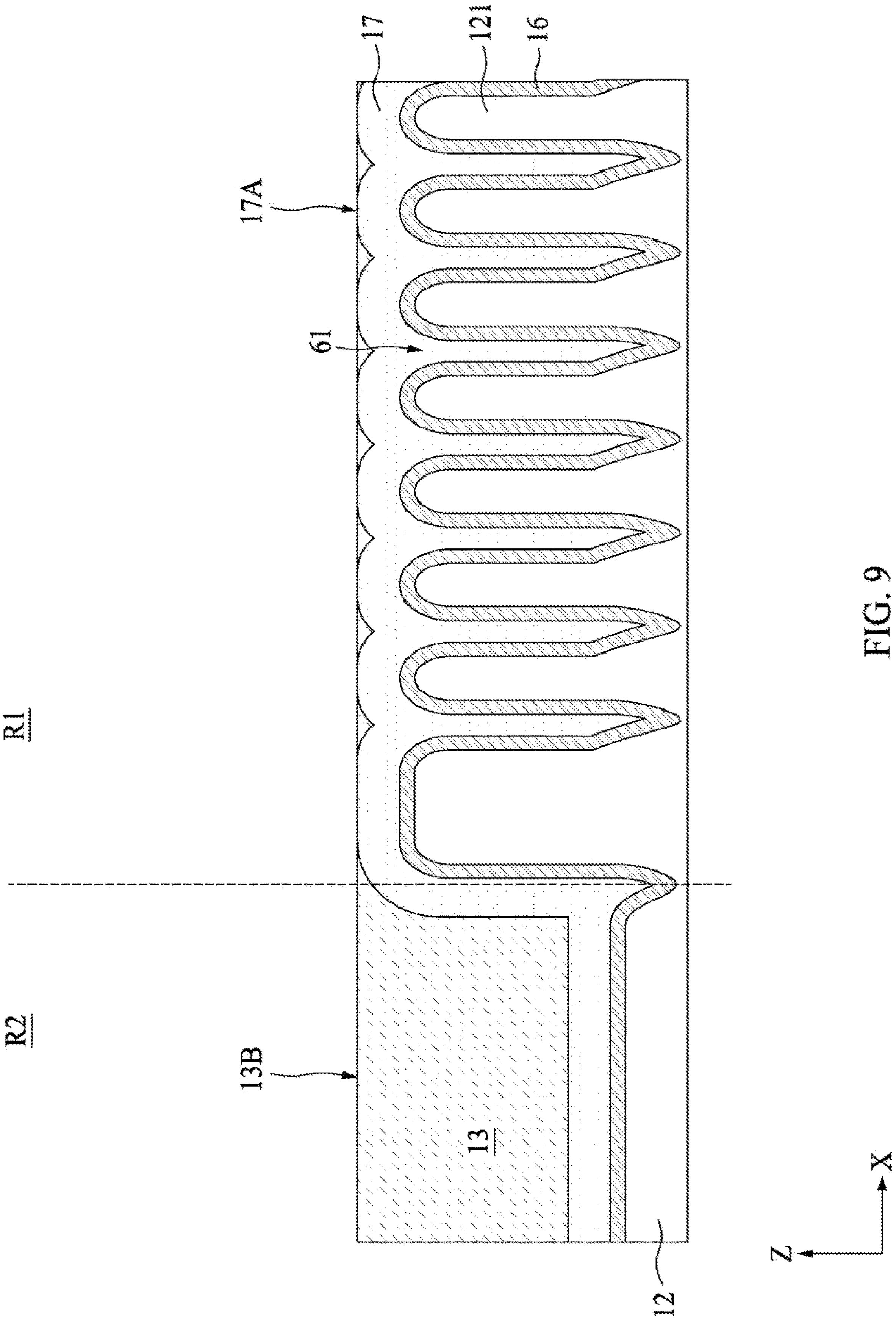

Referring to FIG. 9, the dielectric layer 13 above the dielectric layer 17 is removed. In some embodiments, a polishing operation is performed on the dielectric layer 13 and stops at the dielectric layer 17. In some embodiments, the polishing operation includes a chemical mechanical polishing (CMP) operation. In some embodiments, a slurry of the polishing operation has a high selectivity to the dielectric material of the dielectric layer 13 and a low selectivity to the dielectric material of the dielectric layer 17. In alternative embodiments, an etching operation is performed instead of the polishing operation, and the etching operation stops upon an exposure of the dielectric layer 17. In some embodiments, an etchant of the etching operation has a high selectivity to the dielectric material of the dielectric layer 13 and a low selectivity to the dielectric material of the dielectric layer 17. In some embodiments, the removal of the dielectric layer 13 above the dielectric layer 17 includes a polishing operation, an etching operation, or a combination thereof. In some embodiments, a surface 13B of the dielectric layer 13 is defined after the polishing (or etching) operation. In some embodiments, portions of the top surface 17A of the dielectric layer 17 are exposed through the dielectric layer 13. In some embodiments, the surface 13B of the dielectric layer 13 is substantially coplanar with the exposed portions of the top surface 17A of the dielectric layer 17.

Figure 10:
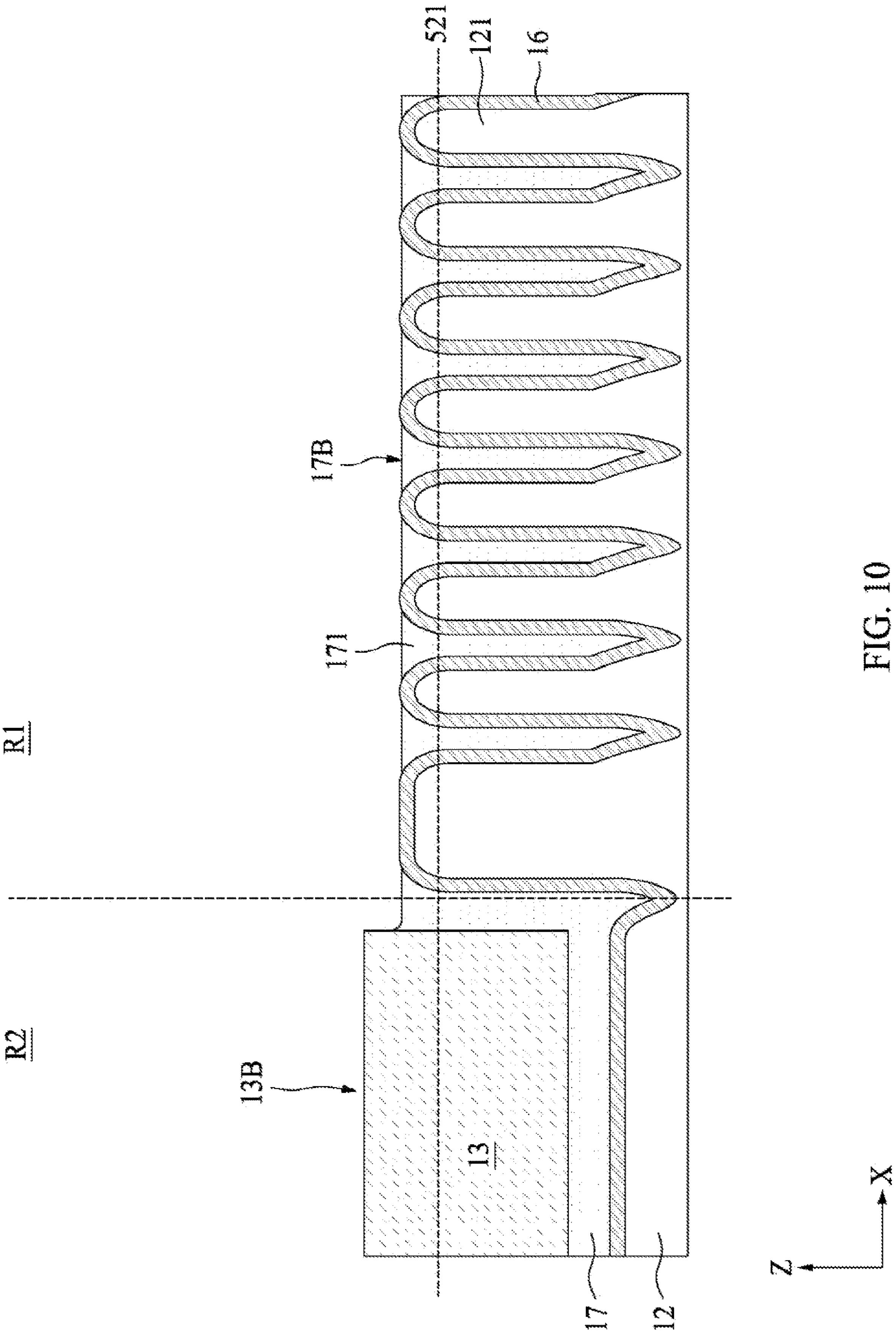

Referring to FIG. 10, the dielectric layer 17 above the oxide layer 16 and the silicon portions 121 is removed. In some embodiments, a polishing operation is performed on the dielectric layer 17 and stops at the oxide layer 16. In some embodiments, the polishing operation includes a CMP operation. In some embodiments, a slurry of the polishing operation has a high selectivity to the dielectric material of the dielectric layer 17 and a low selectivity to the oxide material of the oxide layer 16. In alternative embodiments, an etching operation is performed instead of the polishing operation, and the etching operation stops upon an exposure of the oxide layer 16. In some embodiments, an etchant of the etching operation has a high selectivity to the dielectric material of the dielectric layer 17 and a low selectivity to the oxide material of the oxide layer 16. In some embodiments, the removal of the dielectric layer 17 above the oxide layer 16 includes a polishing operation, an etching operation, or a combination thereof.

In some embodiments, the dielectric layer 13 includes an oxide material similar to or same as that of the oxide layer 16. In some embodiments, the slurry of the polishing operation or the etchant of the etching operation has a low selectivity to the material of the dielectric layer 13. Therefore, the surface 13B of the dielectric layer 13 in the peripheral region R2 remains during and after the removal of the dielectric layer 17 above the oxide layer 16 and the silicon portions 121.

In some embodiments, a surface 17B of the dielectric layer 17 is defined after the polishing (or etching) operation. In some embodiments, a plurality of dielectric portions 171 of the dielectric layer 17 are defined between the silicon portions 121. In some embodiments, top surfaces of the dielectric portions 171 together define the surface 17B of the dielectric layer 17. The plurality of the dielectric portions 171 shown in FIG. 10 may appear connected in a 3D diagram or a top view (not shown) depending on a pattern of the silicon portions 121. Portions of the oxide layer 16 above the silicon portions 121 may be exposed through the dielectric layer 17. In some embodiments, the exposed portions of the oxide layer 16 protrude from the surface 17B of the dielectric layer 17 as shown in FIG. 10. In other words, the surface 17B is below tops of the exposed portions of the oxide layer 16. In some embodiments, the surface 17B of the dielectric layer 17 is substantially coplanar with the exposed portions of the oxide layer 16 (not shown). In some embodiments, the surface 17B of the dielectric layer 17 is above the line 521.

Figure 11:
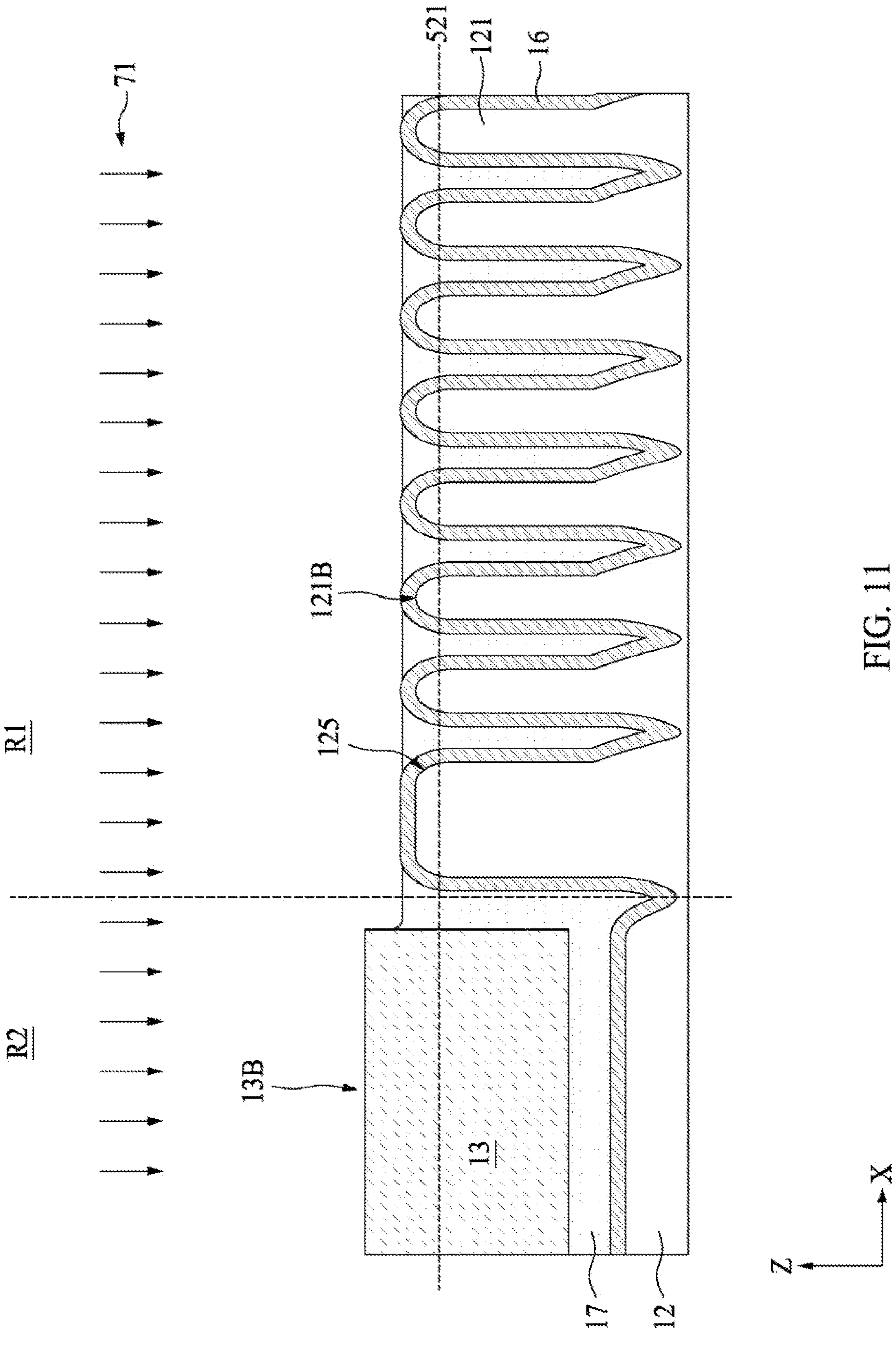

Referring to FIG. 11, a planarization 71 is performed on the dielectric layer 13, the oxide layer 16, the dielectric layer 17, and the silicon portions 121. The planarization 71 functions to remove the dielectric layers 13 and 17, the oxide layer 16, and the silicon portions 121 above the line 521. In some embodiments, the planarization 71 includes an etching operation, such as ion beam etching, directional dry etching, reactive ion etching, solution wet etching, or a combination thereof. In some embodiments, the planarization 71 includes a low-selectivity etching. In some embodiments, the low-selectivity etching includes a low etching selectivity among materials of the dielectric layers 13 and 17, the oxide layer 16 and the substrate 12. In some embodiments, the planarization includes a polishing operation (e.g., a CMP operation). In some embodiments, the planarization includes a polishing operation and an etching operation. In some embodiments, the polishing operation and/or the etching operation includes a solvent having a high selectivity to silicon. In some embodiments, the planarization 71 is a time-mode operation. A duration of the time-mode planarization 71 is controlled so that the time-mode planarization 71 is performed until the dielectric layers 13 and 17, the oxide layer 16, and the silicon portions 121 above the line 521 are removed. In some embodiments, the planarization 71 stops at the line 521. In some embodiments, the planarization 71 stops below the line 521 to ensure that the convex surface 121B is entirely removed.

Figure 12:
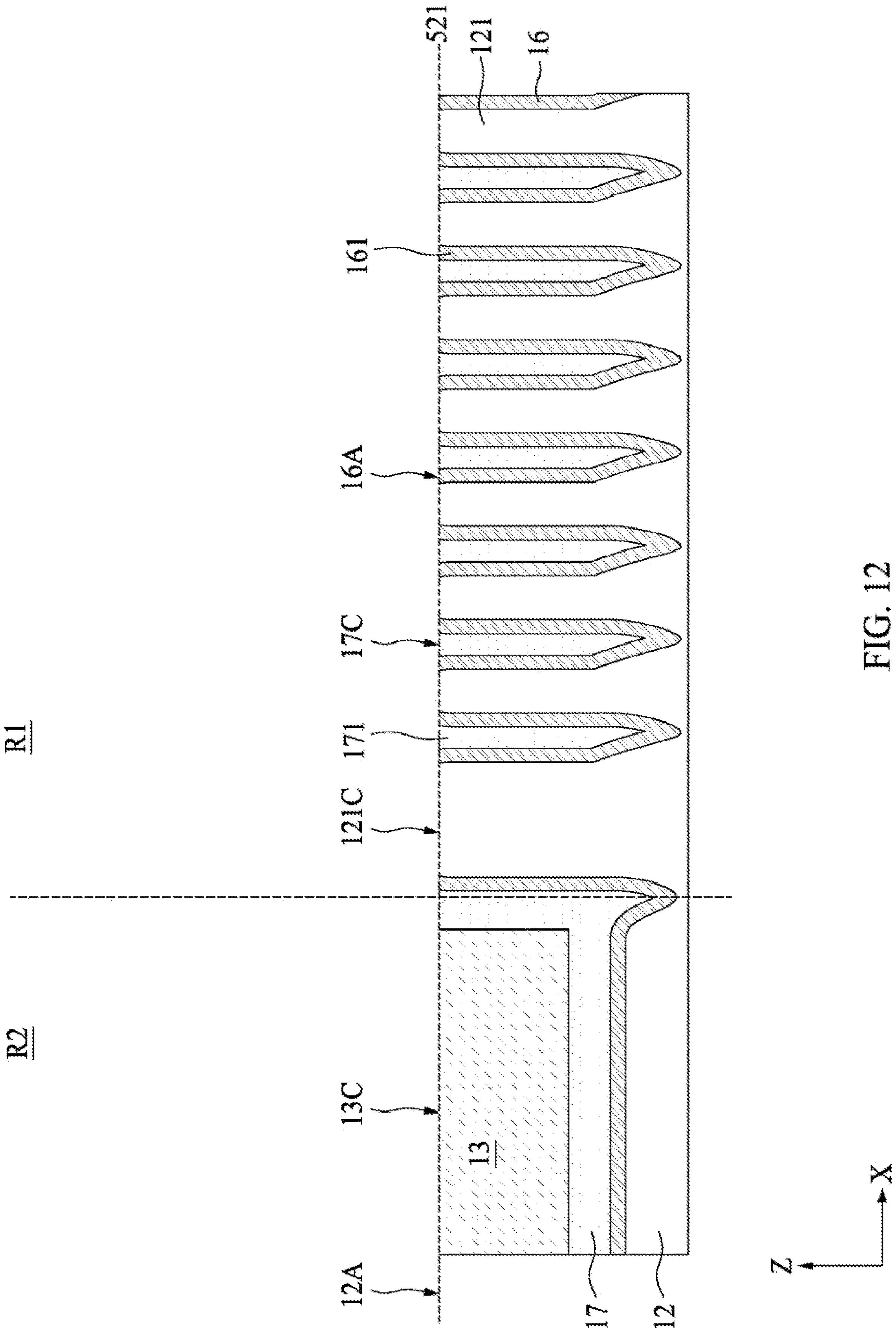

Referring to FIG. 12, FIG. 12 shows a result of the planarization 71. In some embodiments, a height of the dielectric portions 171 of the dielectric layer 17 is reduced. In some embodiments, top surfaces 17C of the dielectric portions 171 are at or below an elevation of the line 521. The plurality of the dielectric portions 171 shown in FIG. 12 may appear connected in a 3D diagram or a top view (not shown) depending on a pattern of the silicon portions 121. In some embodiments, portions of the oxide layer 16 above the line 521 are removed by the planarization 71 to form a plurality of oxide portions 161 surrounding each of the silicon portions 121. The plurality of the oxide portions 161 shown in FIG. 12 may appear connected in a 3D diagram or from a top-view perspective (not shown) depending on the pattern of the silicon portions 121. In some embodiments, a top surface 16A of the oxide layer 16 is defined after the planarization 71 in FIG. 11. In some embodiments, the top surface 16A is defined by top surfaces of the plurality of the oxide portions 161. In some embodiments, top surfaces 121C of the silicon portions 121 of the substrate 12 are defined after the planarization 71 in FIG. 11. In some embodiments, a top surface 13C of the dielectric layer 13 is defined in the peripheral region R2 after the planarization 71 in FIG. 11. In some embodiments, the top surface 13C of the dielectric layer 13, the top surfaces 121C of the silicon portions 121, the top surfaces 161A of the oxide portions 161, and the top surfaces 17C of the dielectric portions 171 are coplanar with one another. In some embodiments, the top surface 13C of the dielectric layer 13, the top surfaces 121C of the silicon portions 121, the top surfaces 161A of the oxide portions 161, and the top surface 17C of the dielectric portions 171 are substantially coplanar. The top surface 13C of the dielectric layer 13, the top surfaces 121C of the silicon portions 121, the top surfaces 161A of the oxide portions 161, and the top surfaces 17C of the dielectric portions 171 together define a surface 12A. In some embodiments, the surface 12A is a planar surface.

FIGS. 13 to 19 are cross-sectional diagrams along a line A-A' shown in FIG. 2 of intermediate stages in the formation of a semiconductor structure 10A in accordance with some embodiments of the present disclosure.

Figure 13:
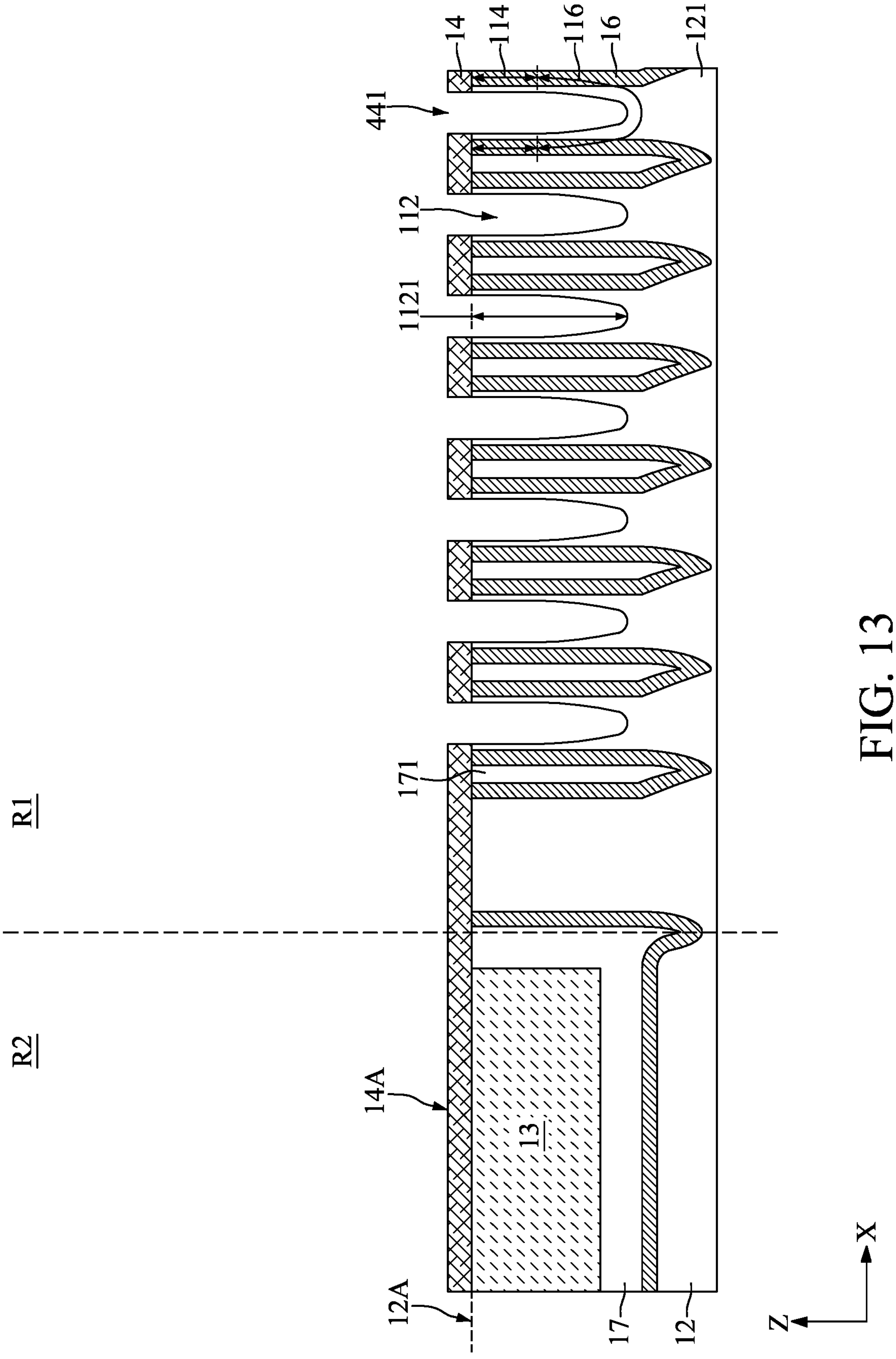

Referring to FIG. 13, an insulating layer 14 may be formed on the surface 12A over the dielectric portions 171, the oxide portions 161, the silicon portions 121, and the dielectric layer 13. In addition, at least one opening 441 may be formed to penetrate the insulating layer 14, and at least one trench 112 may be formed in the silicon portions 121. The insulating layer 14 includes one or more dielectric materials. In some embodiments, the insulating layer 14 is referred to as a dielectric layer 14. In some embodiments prior to the formation of the opening 441 and the trench 112, the insulating layer 14 contacts the dielectric portions 171, the oxide portions 161, the silicon portions 121, and the dielectric layer 13. In some embodiments, the insulating layer 14 is formed in the array region R1 and the peripheral region R2. Since the surface 12A is a substantially planar surface, a top surface 14A of the insulating layer 14 formed on the surface 12A is a substantially planar surface. In some embodiments, the insulating layer 14 includes nitride, such as silicon nitride. In some embodiments, the insulating layer 14 is formed using a CVD process, a PVD process, or any other suitable process. In some embodiments, a thickness of the insulating layer 14 is in a range of 5 to 30 nm.

In some embodiments, the opening 441 and the trench 112 are formed by a first patterning operation. The substrate 12 in the array region R1 and the silicon portions 121 are partially removed by the first patterning operation. The first patterning operation can include one or multiple steps, and the insulating layer 14 and the silicon portions 121 can be patterned concurrently by one etching step or sequentially by different etching steps depending on the materials of the insulating layer 14 and the silicon portions 121. In some embodiments, the opening 441 penetrates and is surrounded by the insulating layer 14. In some embodiments, the opening 441 is defined by the insulating layer 14. In some embodiments, the trench 112 is defined by the silicon portions 121 of the substrate 12. In some embodiments, the trench 112 is formed in a silicon portion 121. In some embodiments, bottoms of the trench 112 may be optionally rounded to reduce defect density and reduce electric field concentration during the operating of the device. In some embodiments, corner effects may be avoided if the trench 112 is a U-shape trench. As shown in FIG. 13, the trench 112 can include an upper segment 114, proximal to the insulating layer 14 and having a uniform width, and a lower segment 116, away from the insulating layer 14 and having a tapering width. In other words, the sidewall of the substrate 12 in the upper segment 114 of the trench 112 is substantially a vertical plane, while the sidewall of the substrate 12 in the lower segment 116 of the trench 112 is a sloped surface, which transitions into the vertical plane. In some embodiments, the upper segment 114 of the trench 112 is wider than the lower segment 116 thereof. In some embodiments, depths 1121 of the trenches 112 measured from the surface 12A may be substantially equal.

Figure 14:
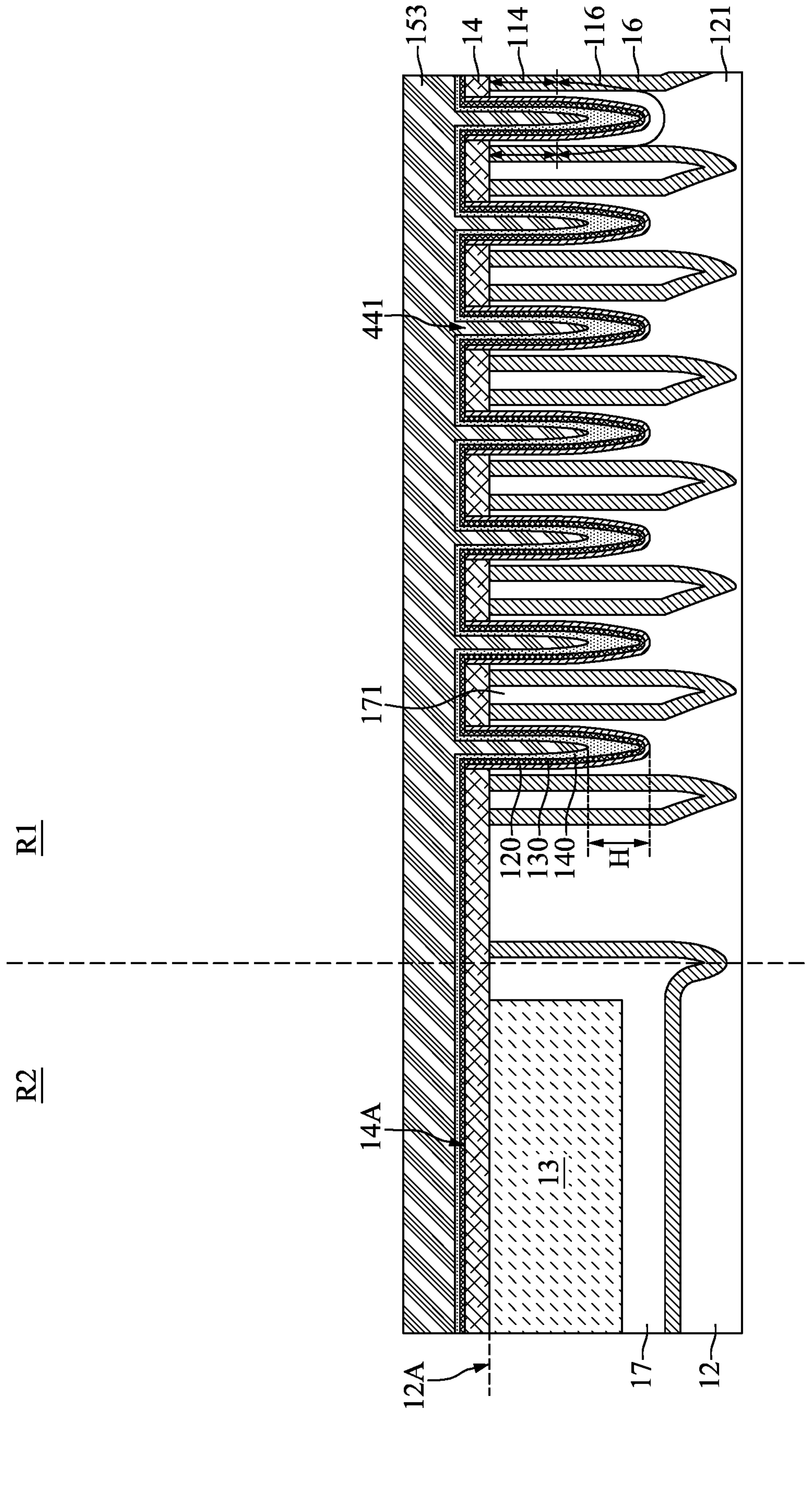

Referring to FIG. 14, a dielectric film 120 lining the trench 112 is formed. In some embodiments, the dielectric film 120 contacts the silicon portions 121. The dielectric film 120, having a substantially uniform thickness, covers exposed portions of the substrate 12, but does not fill the trench 112. In some embodiments, the dielectric film 120 and the insulating layer 14 can include a same material, but the present disclosure is not limited thereto. In some embodiments, the dielectric film 120 may be grown on the exposed portion of the substrate 12 using a thermal oxidation process. In some embodiments, the dielectric film 120 lines sidewalls of the opening 441. In some embodiments, the dielectric film 120 includes oxide, nitride, oxynitride or high-k material and can be deposited using a CVD process, an ALD process, or the like. In some embodiments, an etching process may be performed to remove portions of the dielectric film 120 deposited on the top surface 14A of the insulating layer 14, while portions of the dielectric film 120 deposited on the sidewalls of openings 441 and the trenches 112 are left in place.

Referring to FIG. 14, a diffusion barrier layer 130 is optionally deposited on the dielectric film 120 and the top surface 14A of the insulating layer 14. In some embodiments, the diffusion barrier layer 130 may have a substantially uniform thickness and may cover the dielectric film 120. In some embodiments, the diffusion barrier layer 130 can be formed by a PVD process or an ALD process. In some embodiments, the diffusion barrier layer 130 may be a single-layered structure including refractory metals (such as tantalum or titanium), refractory metal nitrides, or refractory metal silicon nitrides. In alternative embodiments, the diffusion barrier layer 130 may comprise a multi-layered structure including one or more refractory metals, refractory metal nitrides, or refractory metal silicon nitrides.

Referring to FIG. 14, a conductive material 140 is deposited to partially fill the trench 112. The conductive material 140 is conformally deposited over the dielectric film 120. Due to a directionality of the deposition of the conductive material 140 toward the bottom of the trench 112, a rate of deposition of the conductive material 140 at the lower segment 116 of the trench 112 is greater than a rate of deposition of the conductive material 140 at the upper segment 114 of the trench 112. As a result, a thickness of the conductive material 140 at the lower segment 116 of the trench 112 is significantly greater than a thickness of the conductive material 140 at the upper segment 114 of the trench 112. In some embodiments, the deposition of the conductive material 140 stops when the conductive material 140 deposited in the trench 112 reaches a predetermined thickness H, which can circumvent a detrimental short-channel effect and improve device reliability. The conductive material 140 includes polysilicon or metal, such as tungsten, aluminum, copper, molybdenum, titanium, tantalum, ruthenium, or a combination thereof. The conductive material 140 may be formed using a CVD process, a PVD process, an ALD process or another suitable process.

Still referring to FIG. 14, an insulative material 153 is deposited over the conductive material 140 and fills the trench 112. The insulative material 153 has a thickness sufficient to fill the trench 112. The insulative material 153, including nitride, is formed by a (plasma) CVD process. In some embodiments, the insulative material 153 can include silicon nitride. In some embodiments, the insulative material 153 preferably includes a material having a high etching selectivity to the dielectric layer 120, the diffusion barrier layer 130 and the conductive material 140.

Figure 15:
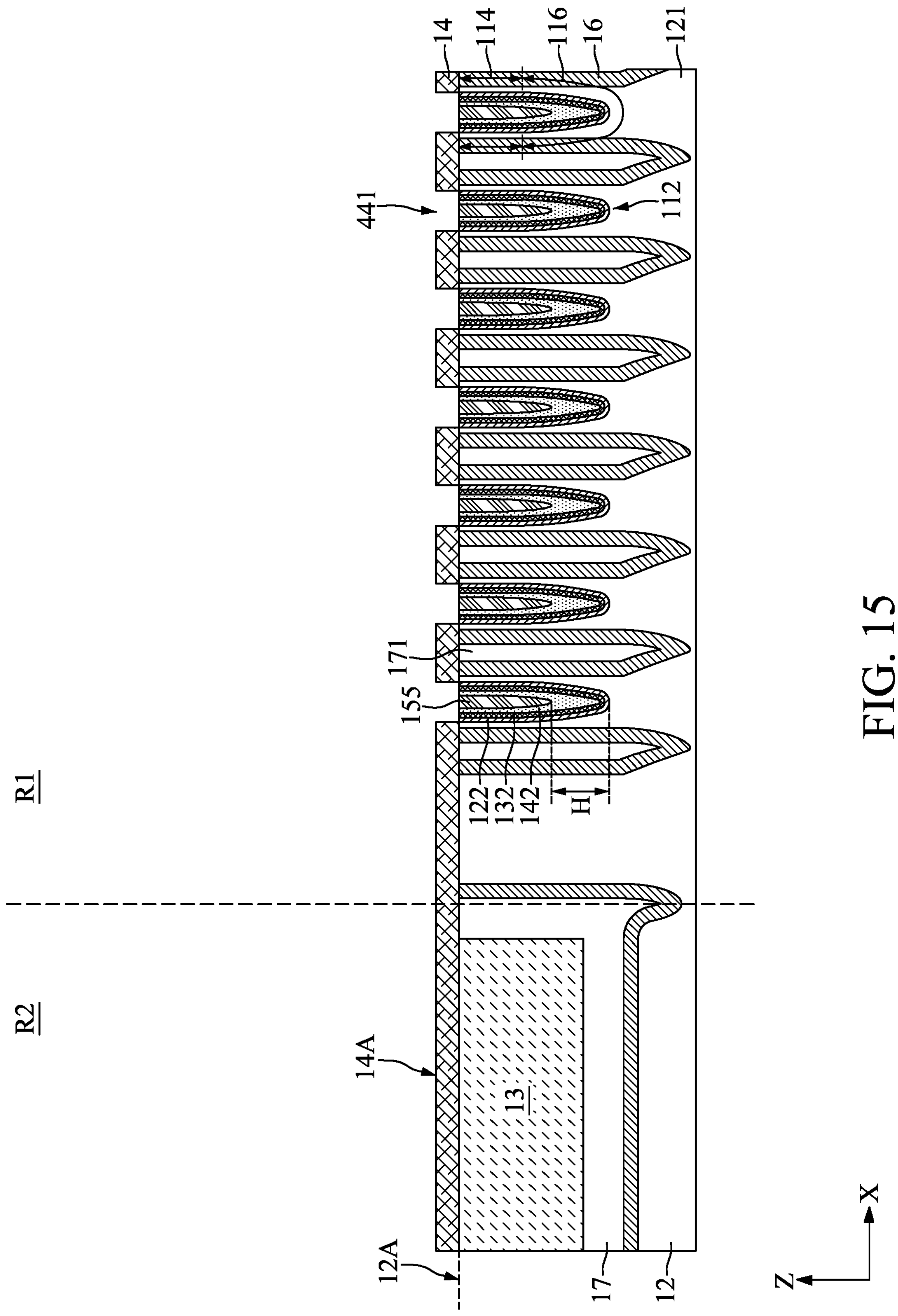

Referring to FIG. 15, a planarization process, such as a chemical mechanical polishing process and/or an etching process, may be sequentially performed to remove portions of the insulative material 153, the dielectric layer 120, the diffusion barrier layer 130 and the conductive material 140 above the surface 12A. As a result, remaining portions of the dielectric layer 120, the diffusion barrier layer 130, the conductive material 140 and the insulative material 153 left in place may respectively turn into a remaining dielectric film 122, a remaining diffusion barrier layer 132, a remaining conductive layer 142, and a plurality of insulative pieces 155.

Figure 16:
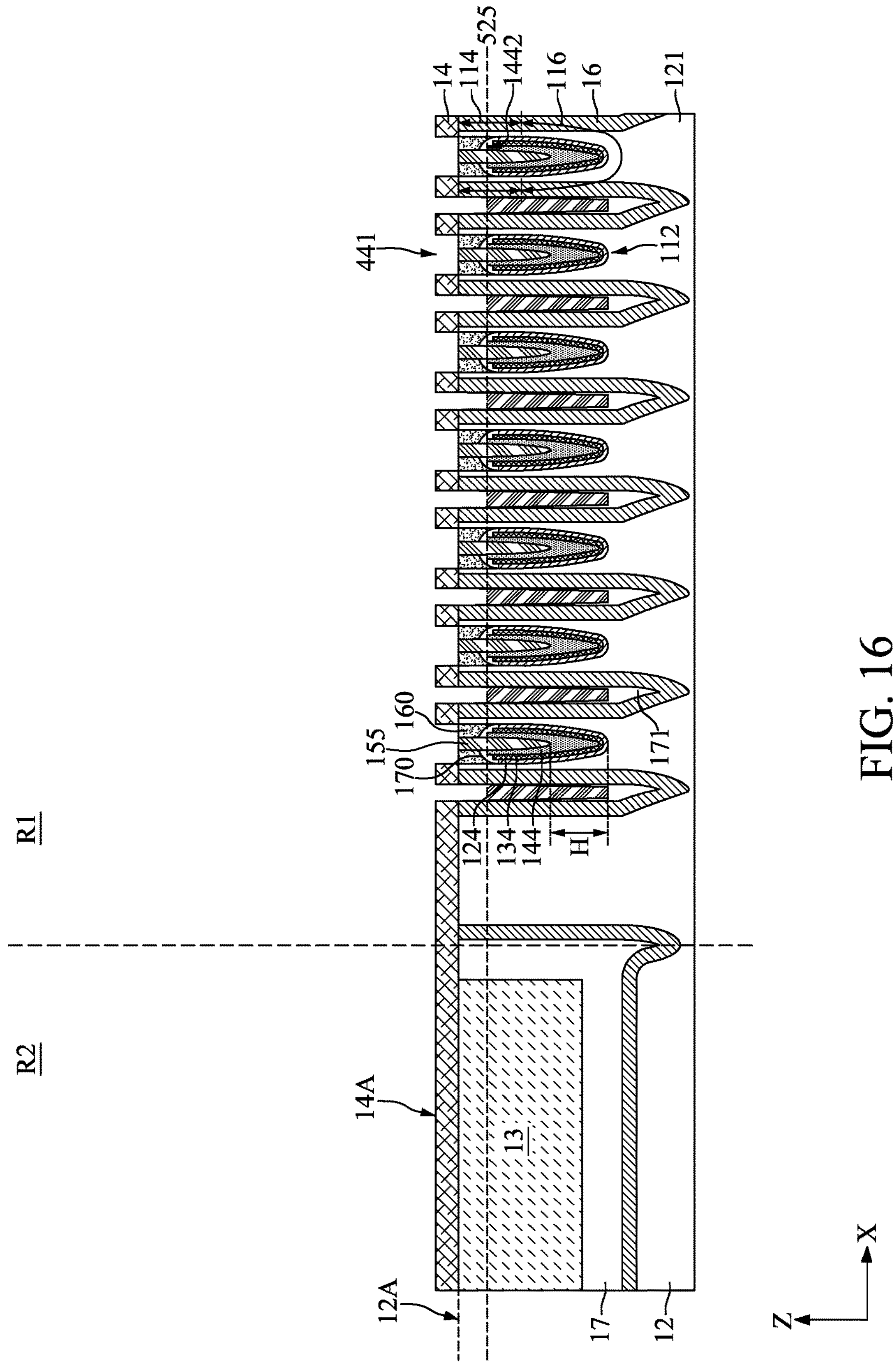

Referring to FIG. 16, the remaining conductive material 142 is recessed to level shown by a dashed line 525 indicating a designed top surface of a WL metal. Thereby, a plurality of word lines 144 are formed. During the formation of the word lines 144, one or multiple steps of an etching process, such as an anisotropic etching process, are performed to remove portions of the remaining conductive material 142 in the trench 112 until the remaining conductive material 142 is level with the dashed line 525 indicating the designed top surface of the WL metal. As a result, after the formation of the word line 144, portions of the remaining diffusion barrier layer 132 and the remaining dielectric film 122 are removed to form a dielectric liner 124 and a diffusion barrier liner 134 between the silicon portion 121 and the word line 144. As shown in FIG. 16, the word lines 144 have a top surface 1442 level with the dashed line 525.

Still referring to FIG. 16, an isolation material 160 is deposited to at least partially fill the trench 112, and one or more voids 170 are formed around the insulative piece 155. The isolation material 160 is conformally and uniformly deposited in the trench 112. Because the insulative piece 155 narrows the width of the trench 112, the voids 170, holding an ambient gas (such as air), can be formed in the isolation material 160 to reduce an effective dielectric constant of the isolation material 160. As shown in FIG. 16, the void 170 is formed around the insulative piece 155. The isolation material 160 can be deposited by a CVD process or an ALD process. In some embodiments, the voids 170 can be introduced in the isolation material 160 by adjusting a deposition rate of the isolation material 160. In detail, the isolation material 160 cannot completely fill the trench 112 when the isolation material 160 is deposited at a rapid rate. In some embodiments, the isolation material 160 may include silicon oxide, silicon nitride, silicon oxynitride, hafnium dioxide or zirconium dioxide.

Figure 17:
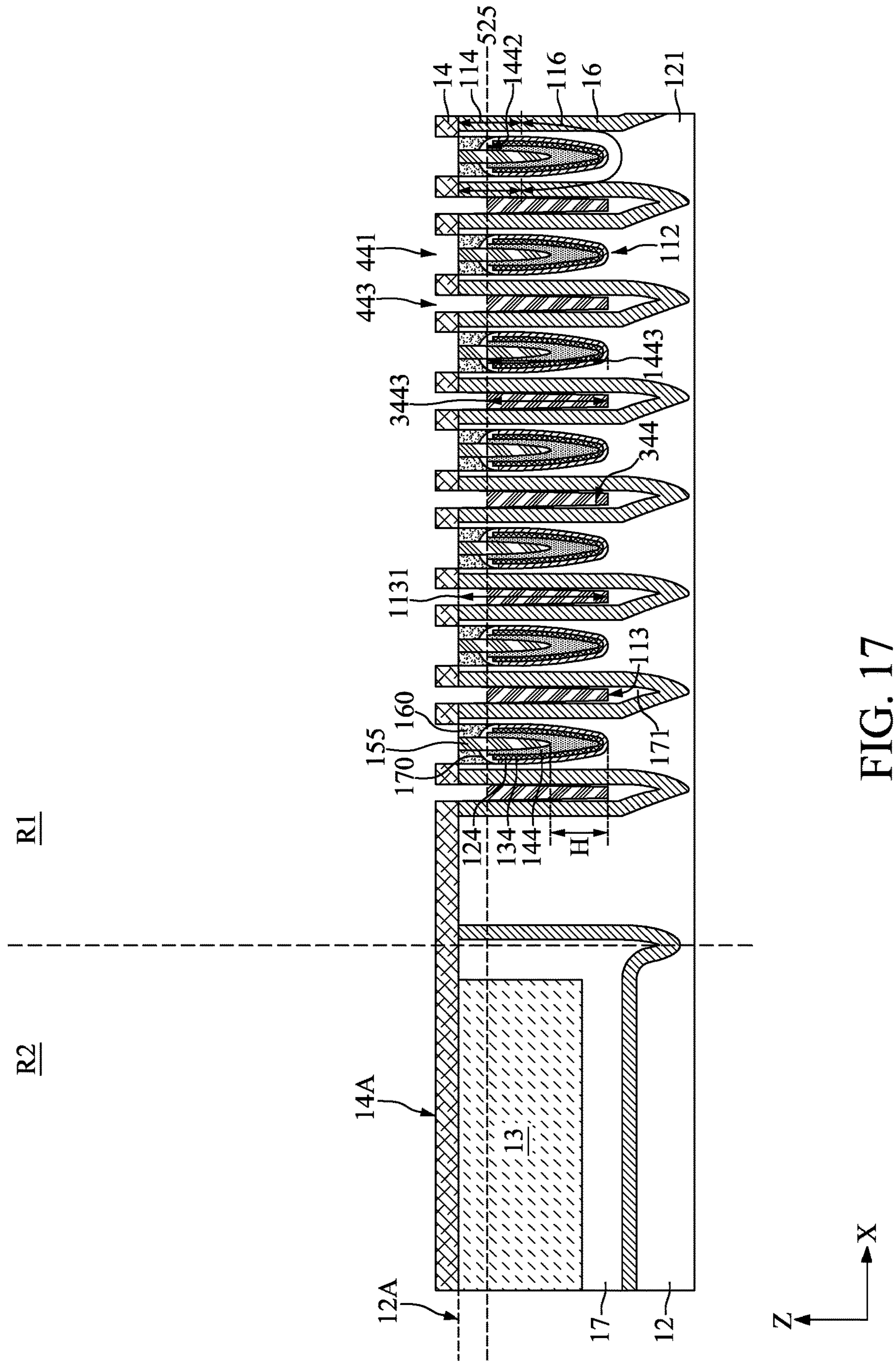

Referring to FIG. 17, a plurality of openings 443 may be formed to penetrate the insulating layer 14, a plurality of trenches 113 may be formed in dielectric portions 171, and a plurality of contacts 344 may be formed in the plurality of trenches 113. A second patterning operation may be performed to form the openings 443 and the trenches 113. The substrate 12 in the array region R1 and the dielectric portions 171 are partially removed by the second patterning operation. The second patterning operation can include one or multiple steps, and the insulating layer 14, the dielectric layer 17 and the dielectric portions 171 can be patterned concurrently by one etching step or sequentially by different etching steps depending on the materials of the insulating layer 14, the dielectric layer 17 and the dielectric portions 171. In some embodiments, each of the openings 443 penetrates and is surrounded by the insulating layer 14. In some embodiments, the openings 443 are defined by the insulating layer 14. In some embodiments, the trenches 113 are defined by the dielectric portions 171 of the substrate 12. In some embodiments, each of the trenches 113 is formed in a dielectric portion 171.

Depths of the trenches 113 may be substantially equal. In some embodiments, a depth 1131 of the trench 113 measured from the surface 12A is different from a depth 1121 (see FIG. 13) of the trench 112 measured from the surface 12A. In some embodiments, the depth 1121 of the trench 112 is substantially less than the depth 1131 of the trench 113. In some embodiments, a difference between the depth 1121 and the depth 1131 is due to different etching rates on different materials during one etching step of the patterning operation. In some embodiments, the trench 112 and the trenches 113 are formed by different etching steps, and the depths 1121 and the depths 1131 are controlled to be different for a purpose of formation of WL metals performed during subsequent processing.

Still referring to FIG. 17, the contacts 344 may be formed by depositing a conductive material (not shown) over the substrate 12 and the patterned insulating layer 14. The conductive material may fill the openings 443 and the trenches 113. In some embodiments, the conductive material fills an entirety of the trenches 113. In some embodiments, the conductive material is formed by a deposition. In some embodiments, the conductive material includes aluminum (Al), copper (Cu), tungsten (W), titanium (Ti), tantalum (Ta), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr), titanium nitride (TiN), tungsten nitride (WN), tantalum nitride (TaN), ruthenium (Ru), titanium silicon nitride (TiSiN), other suitable materials, or a combination thereof. In some embodiments, the conductive material is W, TiN, or a combination thereof. In some embodiments, an upper portion of the conductive material is removed. In some embodiments, a plurality of contacts 344 are formed in the trenches 113. In some embodiments, the contacts 344 are referred to as WL metals.

Referring to FIG. 17, for a purpose of electrical connection, the designed top surface 525 should be below the surface 12A (or a top surface of the substrate 12). In other words, a distance from the surface 12A to the designed top surface 525 should be greater than zero. However, a range of the distance can be adjusted according to different applications, and the distance is not limited herein. In addition, it should be noted that the figures are for a purpose of illustration, and tops of different contacts 344 and/or word lines 144 can be at roughly a same elevation but not necessarily at a same horizontal level. In some embodiments, a height 1443 of the word lines 144 and a height 3443 of the contacts 344 from the designed top surface 525 are different due to different depths 1121 and 1131 of the trenches 112 and 113. In some embodiments, the height 1443 of the word lines 144 is substantially less than the height 3443 of the contacts 344 from the designed top surface 525.

Figure 18:
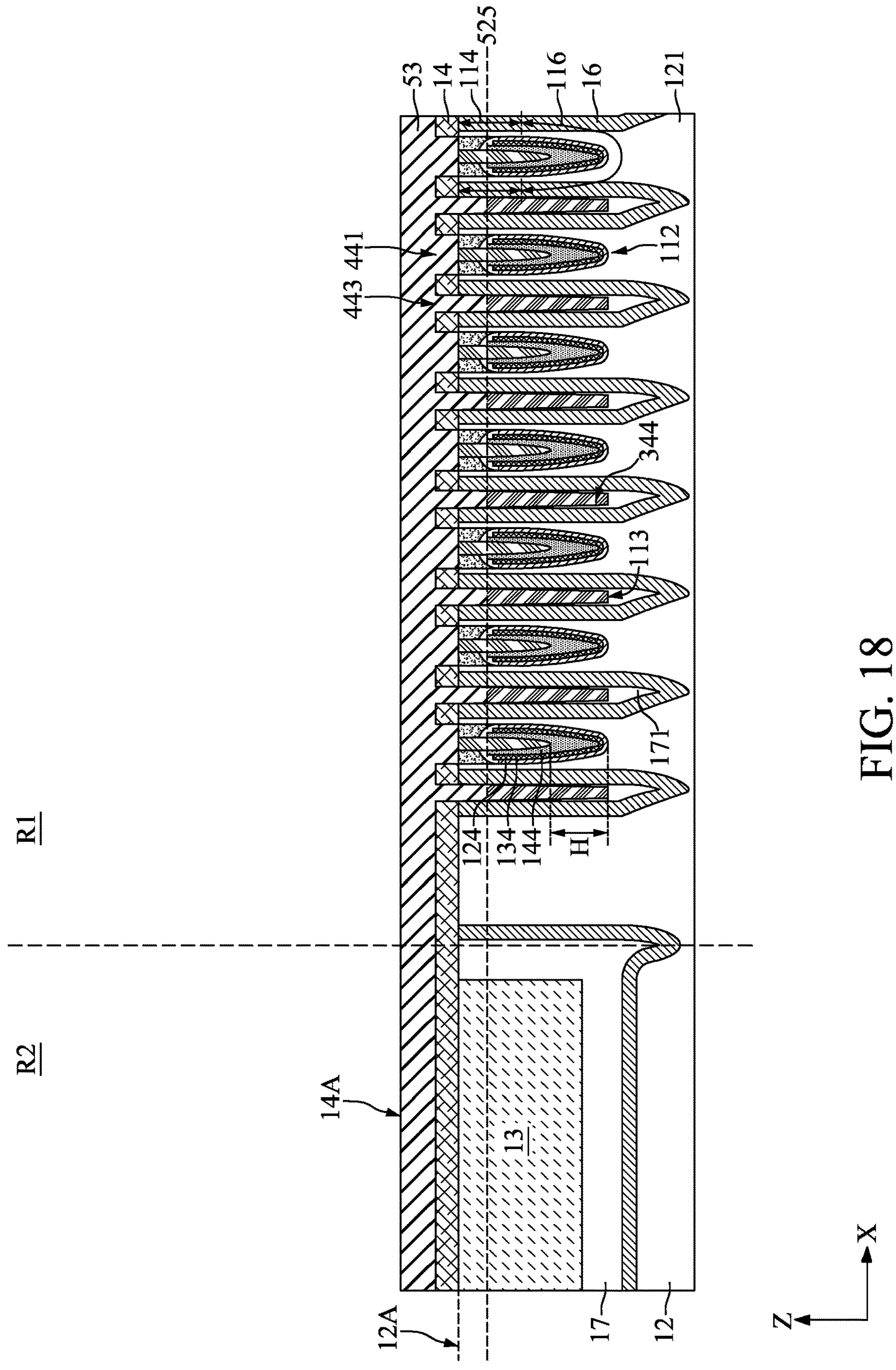
Figure 19:
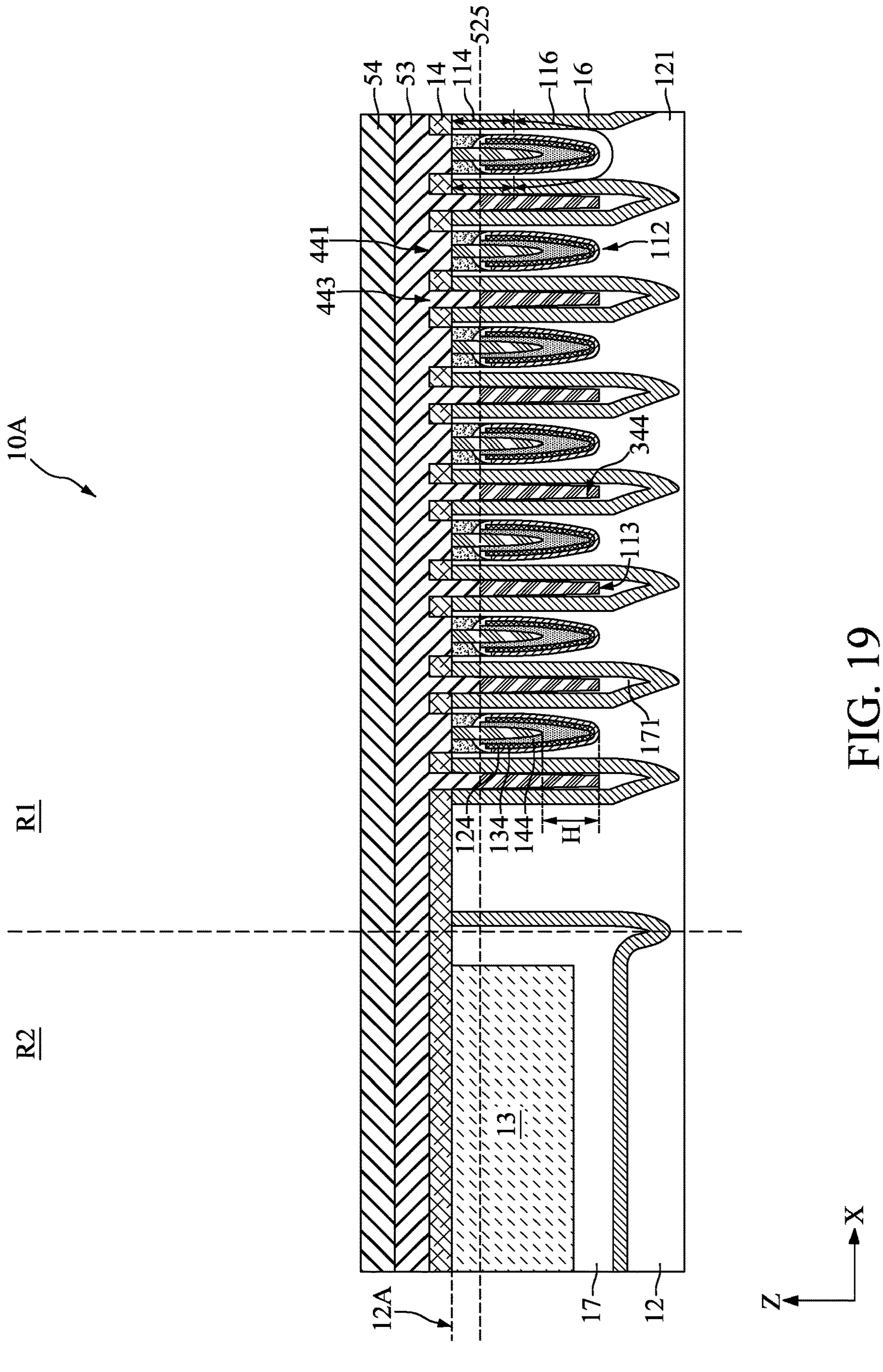

Referring to FIGS. 18 and 19, a first dielectric layer 53 and a second dielectric layer 54 are sequentially formed over the substrate 12. The first dielectric layer 53 and the second dielectric layer 54 may cover the contacts 344, the word lines 144 and the patterned insulating layer 14. In some embodiments, the first dielectric layer 53 and the second dielectric layer 54 include different dielectric materials. In some embodiments, the first dielectric layer 53 includes nitride (e.g., silicon nitride), and the second dielectric layer 54 includes oxide (e.g., silicon oxide). In some embodiments, the first dielectric layer 53 fills the trench 112 above the word line 144. In some embodiments, the first dielectric layer 53 fills the trenches 113 above the contacts 344. In some embodiments, the first dielectric layer 53 fills the openings 441 and 443. In some embodiments, the first dielectric layer 53 covers an entirety of the patterned insulating layer 14. In some embodiments, the second dielectric layer 54 covers an entirety of the first dielectric layer 53. The semiconductor structure 10A is thereby formed.

Figure 20:
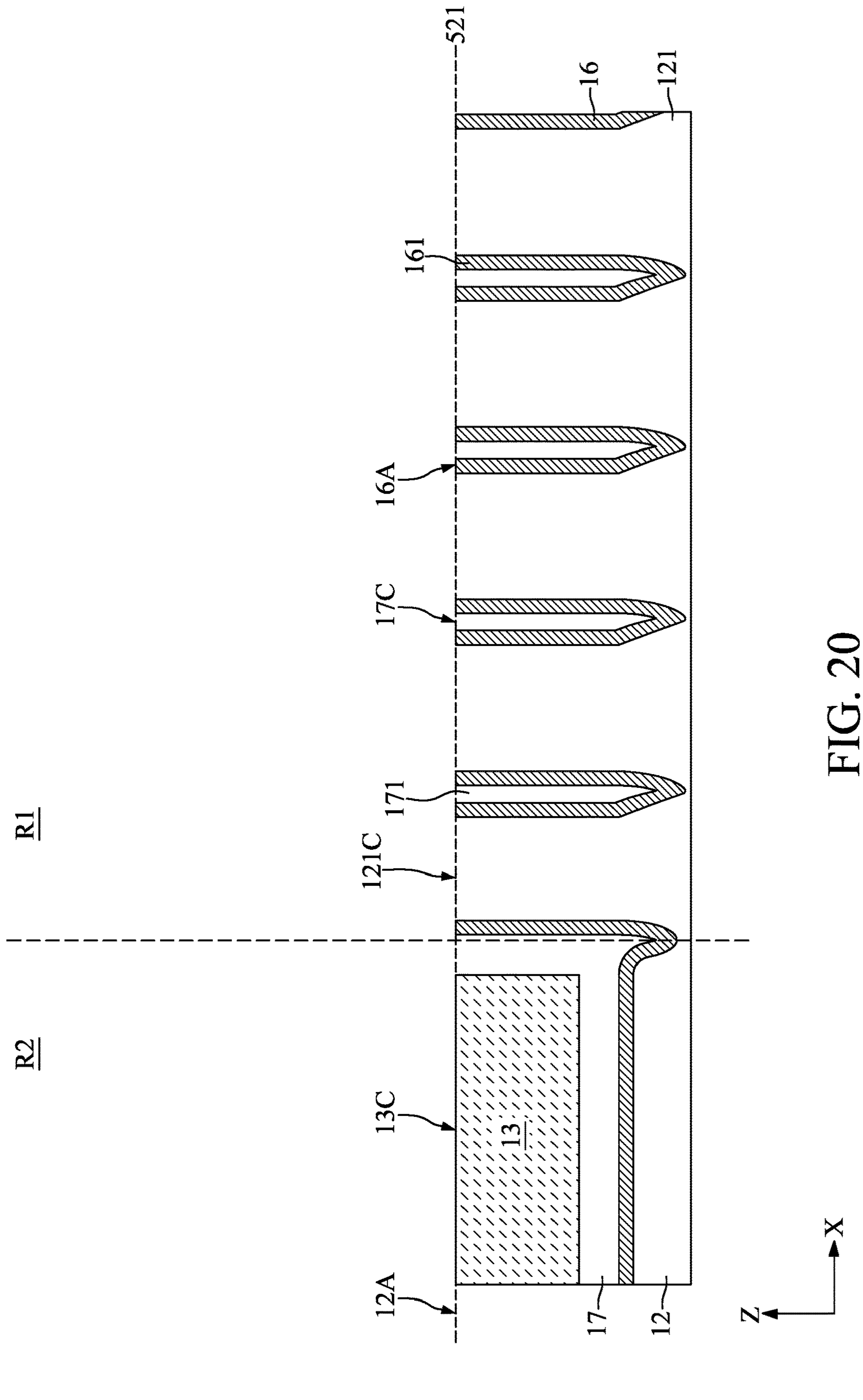
FIGS. 20 to 21 are cross-sectional diagrams of intermediate stages in formation of a semiconductor structure in accordance with various embodiments of the present disclosure.
Figure 21:
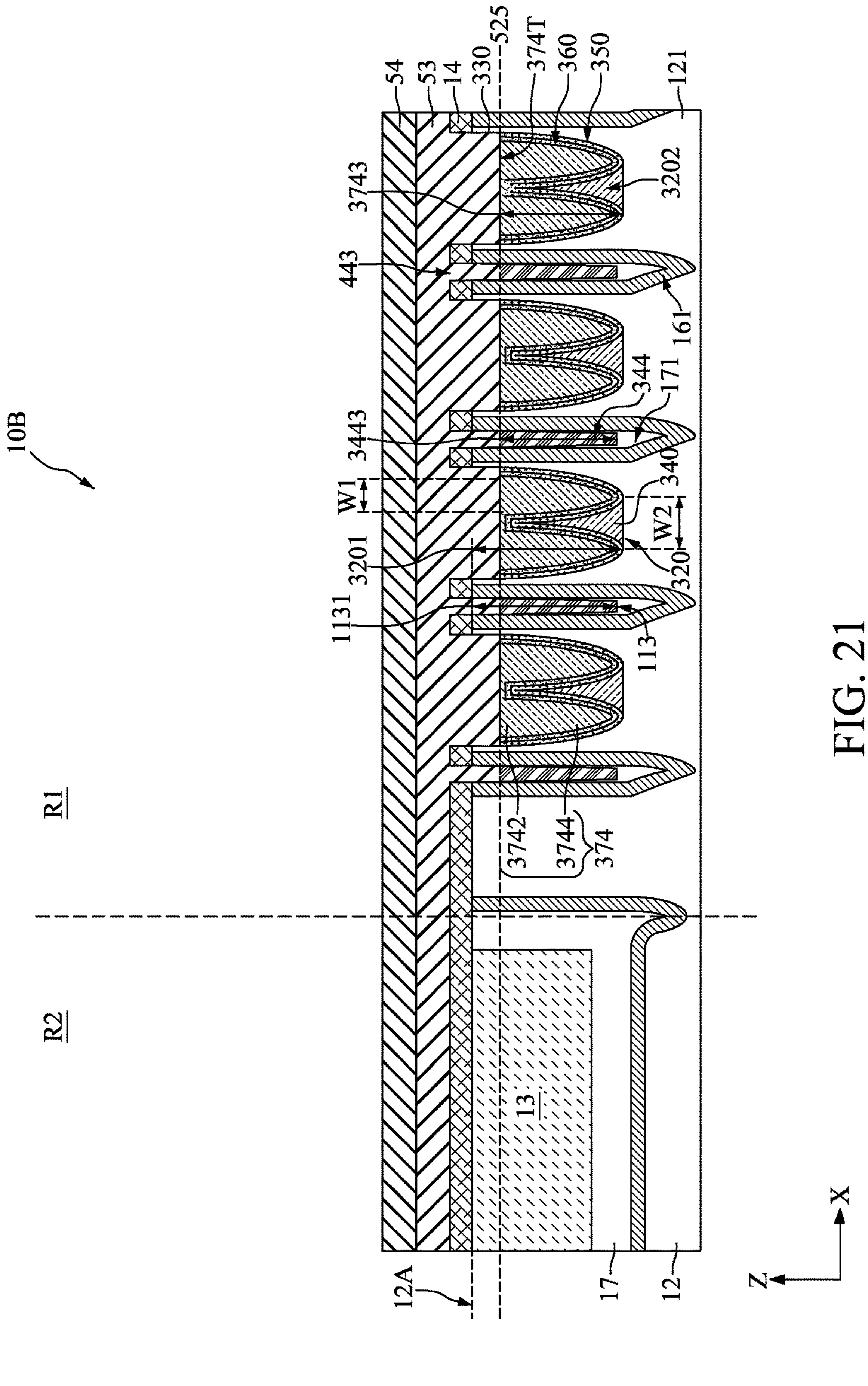

FIGS. 20 to 21 are cross-sectional diagrams along a line A-A' shown in FIG. 2 of intermediate stages in the formation of a semiconductor structure 10B in accordance with some embodiments of the present disclosure.

Referring to FIG. 20, an intermediate structure is provided. The intermediate structure in FIG. 20 is similar to the structure in FIG. 12, except the intermediate structure in FIG. 20 has a sparser arrangement of the dielectric portions 171. In other words, a distance between a dielectric portion 171 and an adjacent one in FIG. 20 is greater than that in FIG. 12.

Referring to FIG. 21, the formation of the semiconductor structure 10B includes forming at least one trench 320, forming a plurality of first impurity regions 330 and a plurality of second impurity regions 340 in the substrate 12, forming an isolation film 350 lining the trench 320, forming a diffusion barrier film 360 on the isolation film 350, forming a word line 374 on the diffusion barrier film 360 and filling the trench 320, forming a plurality of trenches 113, and forming a plurality of contacts 344 in the trenches 113.

In some embodiments, the trench 320 has a W-shaped contour. In some embodiments, the trench 320 is formed by a patterning process and at least one reactive ion etching (RIE) process. In some embodiments, the trench 320 has a depth 3201 measured from the surface 12A. In some embodiments, a protrusion 3202 is formed in the W-shaped trench 320. In some embodiments, the protrusion 3202 is disposed at a center of the trench 320.

In some embodiments, the substrate 12 and the first impurity region 330 have a same conductivity type. In some embodiments, the second impurity region 340 and the first impurity region 330 have different conductivity types. In some embodiments, the second impurity region 340 is disposed between a pair of legs 3744 of the word line 374.

In some embodiments, the isolation film 350, having a substantially uniform thickness, covers an inner surface the trench 320, but does not fill the trench 320. In other words, the isolation film 350 has a topology following a topology of the trench 320. In some embodiments, the isolation film 350 is grown on the inner surface of the trench 320 using a thermal oxidation process. In alternative embodiments, the isolation film 350 can be formed using a CVD process or an atomic layer deposition (ALD) process.

In some embodiments, the diffusion barrier film 360, having a substantially uniform thickness, covers the isolation film 350, but does not fill the trench 320. In order to ensure a step coverage, the diffusion barrier film 360 can be formed using a PVD process or an ALD process, for example, wherein the diffusion barrier film 360 deposited using the ALD process is highly uniform in thickness. In some embodiments, the diffusion barrier film 360 is uniformly and conformally deposited on the isolation film 350. In some embodiments, the diffusion barrier film 360 may be a single-layered structure including refractory metals (such as tantalum and titanium), refractory metal nitrides, or refractory metal silicon nitrides. In alternative embodiments, the diffusion barrier film 360 may include a multi-layered structure including one or more refractory metals, refractory metal nitrides, or refractory metal silicon nitrides.

In some embodiments, the word line 374 may be formed in the trench 320. The word line 374 may have a W-shaped contour. The word line 374 has a top surface 374T coplanar with a designed top surface 525. The word line 374 has a height 3743. Materials of the word line 374 include polysilicon or metal, such as tungsten, copper, aluminum, molybdenum, titanium, tantalum, ruthenium, or a combination thereof. The word line 374 may be formed using a CVD process, a PVD process, an ALD process or another suitable process. The W-shaped word line 374 includes the legs 3744 and bases 3742. The legs 3744 have a width W1 that gradually decreases at positions of increasing distance from the top surface 12A of the substrate 12. Because the width W1 of the legs 3744 of the word line 374 gradually decreases at positions of increasing distance from the top surface 12A of the substrate 12, the second impurity region 340, between the legs 3744 of the word line 374, has a width W2 that gradually increases at positions of increasing distance from the base 3742 of the word line 374.

Depths of the trenches 113 may be substantially equal. In some embodiments, a depth 1131 of the trench 113 measured from the surface 12A is different from a depth 3201 of the trench 320 measured from the surface 12A. In some embodiments, the depth 3201 of the trench 320 is substantially less than the depth 1131 of the trench 113. In some embodiments, a difference between the depth 3201 and the depth 1131 is due to different etching rates on different materials during one etching step of the patterning operation. In some embodiments, the trenches 320 and the trenches 113 are formed by different etching steps, and the depths 3201 and the depths 1131 are controlled to be different for a purpose of formation of WL metals performed during subsequent processing.

In some embodiments, the contacts 344 may be formed by depositing a conductive material (not shown) over the substrate 12 and the patterned insulating layer 14. The conductive material may fill the openings 443 and the trenches 113. In some embodiments, the conductive material fills an entirety of the trenches 113. In some embodiments, the conductive material is formed by a deposition. In some embodiments, the conductive material includes aluminum (Al), copper (Cu), tungsten (W), titanium (Ti), tantalum (Ta), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr), titanium nitride (TiN), tungsten nitride (WN), tantalum nitride (TaN), ruthenium (Ru), titanium silicon nitride (TiSiN), other suitable materials, or a combination thereof. In some embodiments, the conductive material is W, TiN, or a combination thereof. In some embodiments, an upper portion of the conductive material is removed. In some embodiments, a plurality of the contacts 344 are formed in the trenches 113. In some embodiments, the contacts 344 are referred to as WL metals. In some embodiments, the contact 344 has a height 3443 greater than the height 3743 of the word line 374.

Bit line (BL) metals may be formed over the semiconductor structure 10A in FIG. 19 or the semiconductor structure 10B in FIG. 21. In some embodiments, landing pads are formed after the BL metals to electrically connect with silicon portions 121 in an array region R1. The present disclosure provides the silicon portions 121 having planar top surfaces respectively, and thus issues of electrical disconnection or high electric resistance between a silicon pillar and a landing pad resulting from rounding of the silicon pillar can be prevented. A performance of a device formed according to the method and a product yield can be thereby improved.

To conclude the operations as illustrated in FIGS. 1 to 21 above, a method S1 and a method S2 within a same concept of the present disclosure are provided.

FIG. 22 is a flow diagram illustrating a method S1 for manufacturing a semiconductor device in accordance with some embodiments of the present disclosure. The method S1 includes a number of operations (S11, S12, S13, S14 and S15) and the description and illustration are not deemed as a limitation to the sequence of the operations. In the operation S11, a substrate is provided, wherein the substrate includes a plurality of pillars, and a top surface of each of the plurality of pillars is a substantially planar surface. In the operation S12, a first oxide layer is formed over the substrate conformal to the plurality of pillars, wherein the formation of the first oxide layer includes oxidizing top corners of the plurality of pillars, thereby causing the top surface of each of the plurality of pillars to become a convex surface. In the operation S13, a first dielectric layer is formed among the plurality of pillars, wherein the first oxide layer above the plurality of pillars is partially exposed through the first dielectric layer. In the operation S14, a planarization is performed on the plurality of pillars to partially or entirely remove the convex surfaces. In the operation S15, a second dielectric layer is formed over the plurality of pillars, the first oxide layer and the first dielectric layer, wherein a top surface of the second dielectric layer is a substantially planar surface. It should be noted that the operations of the method S1 may be rearranged or otherwise modified within the scope of the various aspects. Additional processes may be provided before, during, and after the method S1, and some other processes may be only briefly described herein. Thus, other implementations are possible within the scope of the various aspects described herein.

Figure 23:
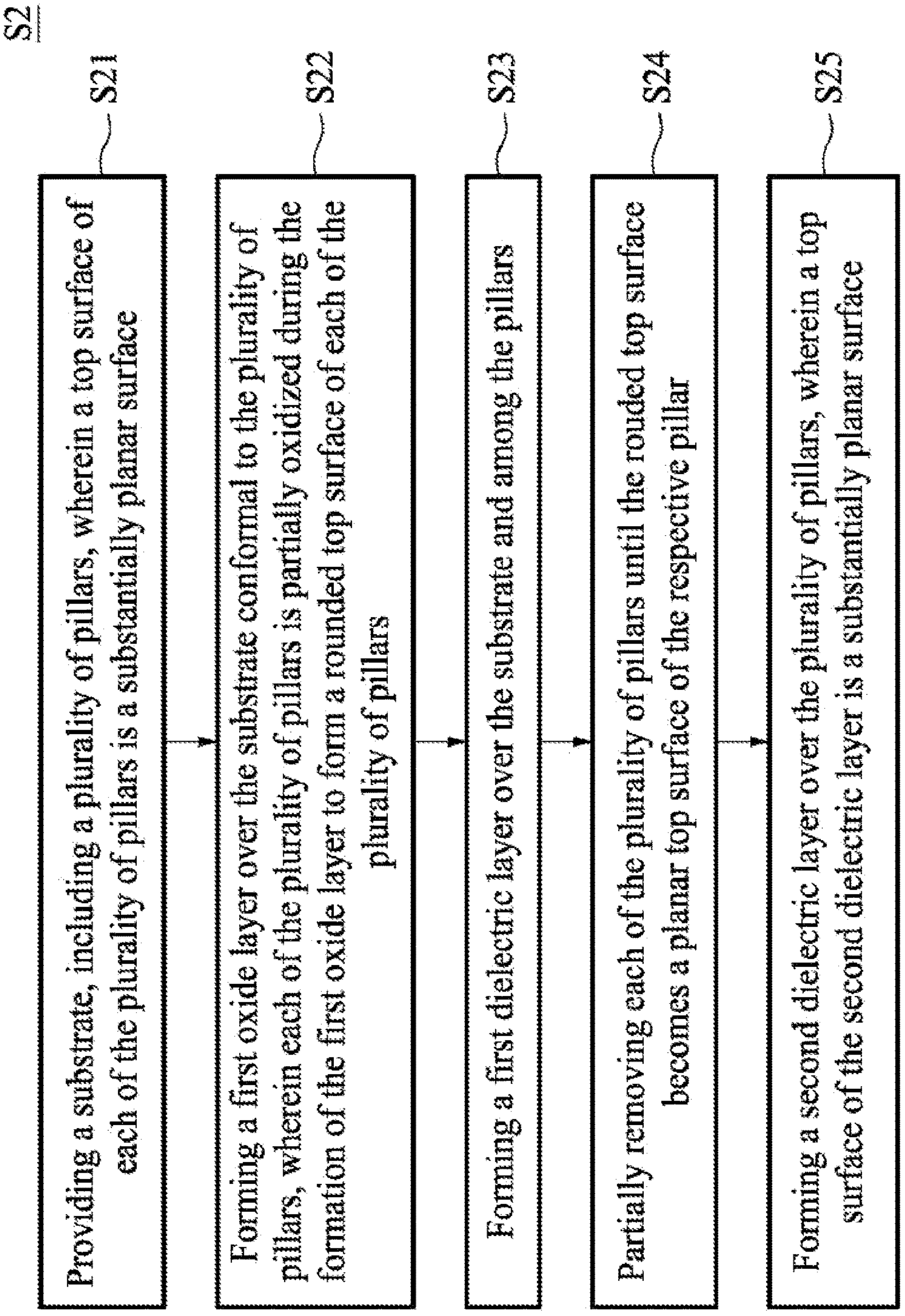
FIG. 23 is a flow diagram illustrating a method of manufacturing a semiconductor structure in accordance with some embodiments of the present disclosure.

FIG. 23 is a flow diagram illustrating a method S2 for manufacturing a semiconductor device in accordance with some embodiments of the present disclosure. The method S2 includes a number of operations (S21, S22, S23, S24 and S25) and the description and illustration are not deemed as a limitation to the sequence of the operations. In the operation S21, a substrate is provided, wherein the substrate includes a plurality of pillars, and a top surface of each of the plurality of pillars is a substantially planar surface. In the operation S22, a first oxide layer is formed over the substrate conformal to the plurality of pillars, wherein each of the plurality of pillars is partially oxidized during the formation of the first oxide layer to form a rounded top surface of each of the plurality of pillars. In the operation S23, a first dielectric layer is formed over the substrate and among the pillars. In the operation S24, each of the plurality of pillars is partially removed until the rounded top surface becomes a planar top surface of the respective pillar. In the operation S25, a second dielectric layer is formed over the plurality of pillars, wherein a top surface of the second dielectric layer is a substantially planar surface. It should be noted that the operations of the method S2 may be rearranged or otherwise modified within the scope of the various aspects. Additional processes may be provided before, during, and after the method S2, and some other processes may be only briefly described herein. Thus, other implementations are possible within the scope of the various aspects described herein.

The method S1 and the method S2 are within a same concept of the present disclosure, and in order to further illustrate details of the method S1 and the method S2, and the concept of the present disclosure, the method S1 and the method S2 are comprehensively described with embodiments of the present disclosure as above.

Therefore, the present disclosure provides a manufacturing method and a semiconductor structure thereof. The manufacturing method of the present disclosure is able to provide a planar surface of a silicon pillar so as to avoid issues of electrical disconnection and high electrical resistance. A performance of a device formed according to the method and a product yield can be thereby improved.

One aspect of the present disclosure provides a method for manufacturing a semiconductor structure. The method includes creating at least one first trench in a substrate; depositing a conductive material to partially fill the first trench; forming an insulative piece in the first trench and extending into the conductive material; and depositing an isolation material in the first trench to cap a portion of the conductive material exposed around the insulative piece. The depositing of the isolation material further comprises enclosing at least one void in the isolation material.

Another aspect of the present disclosure provides a method for manufacturing a semiconductor structure. The method includes forming a silicon portion, a plurality of dielectric portions and a plurality of oxide portions in a substrate; forming at least one first trench in the silicon portion of the substrate; forming a word line in the first trench; forming a plurality of first impurity regions and a plurality of second impurity regions in the substrate; forming a first dielectric layer over the substrate and covering the word line; and forming a second dielectric layer to cover the first dielectric layer. The first trench has a W-shaped contour. Each of the second impurity regions is disposed between a pair of legs of the word line.

Another aspect of the present disclosure provides a semiconductor structure. The semiconductor structure includes a substrate having a silicon portion, a plurality of dielectric portions and a plurality of oxide portions; at least one first trench disposed in the silicon portion of the substrate; a word line disposed in the first trench; and a plurality of first impurity regions and a plurality of second impurity regions disposed in the substrate. The first trench has a W-shaped contour. Each of the second impurity regions is disposed between a pair of legs of the word line.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A method for manufacturing a semiconductor structure, comprising:
- creating at least one first trench in a substrate;
- depositing a conductive material to partially fill the first trench;
- forming an insulative piece in the first trench, wherein the insulative piece extends into the conductive material;
- depositing an isolation material in the first trench to cap a portion of the conductive material exposed around the insulative piece, wherein the depositing of the isolation material further comprises enclosing at least one void in the isolation material;
- forming an insulating layer over the substrate; and
- forming at least one first opening in the insulating layer, wherein the first trench is formed through the first opening.

2. The method of claim 1, wherein first depths of the first trenches are substantially equal.

3. The method of claim 2, wherein the first trench is disposed in a silicon portion of the substrate.

4. The method of claim 3, wherein before the deposition of the conductive material, the method further comprises:
- forming a dielectric film lining the first trench and the first opening; and
- forming a diffusion barrier layer lining the dielectric film and over the insulating layer, wherein the diffusion barrier layer is disposed between the dielectric film and the conductive material.

5. The method of claim 4, wherein the formation of the insulative piece comprises:
- depositing an insulative material to cover the insulating layer, the opening, and the first trench; and
- performing a removal process to remove portions of the insulative material above a surface of the substrate.

6. The method of claim 5, further comprising forming a word line by recessing a remaining portion of the conductive material to a designed top surface.

7. The method of claim 6, further comprising:
- forming a plurality of second openings in the insulating layer;
- forming a plurality of second trenches in the substrate through the plurality of second openings; and
- forming a plurality of contacts in the second trenches.

8. The method of claim 7, wherein a depth of the second trench is greater than a depth of the first trench.

9. The method of claim 8, wherein a height of the contact is greater than a height of the word line.

10. The method of claim 9, further comprising:
- forming a first dielectric layer to cover the insulating layer, the first openings and the second openings; and
- forming a second dielectric layer to cover the first dielectric layer.

* * * * *